United States Patent
Afonina et al.

(10) Patent No.: US 10,879,474 B2
(45) Date of Patent: Dec. 29, 2020

(54) ORGANIC DIELECTRIC LAYER AND ORGANIC ELECTRONIC DEVICE

(71) Applicants: PROMERUS, LLC, Brecksville, OH (US); MERCK PATENT GMBH, Darmstadt (DE)

(72) Inventors: Irina Afonina, Southampton (GB); Tomas Backlund, Darmstadt (DE); Larry F Rhodes, Brecksville, OH (US); Hugh A Burgoon, Brecksville, OH (US)

(73) Assignees: PROMERUS, LLC, Akron, OH (US); MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 16/302,108

(22) PCT Filed: May 15, 2017

(86) PCT No.: PCT/EP2017/061562
§ 371 (c)(1),
(2) Date: Nov. 16, 2018

(87) PCT Pub. No.: WO2017/198587
PCT Pub. Date: Nov. 23, 2017

(65) Prior Publication Data
US 2019/0148657 A1    May 16, 2019

Related U.S. Application Data

(60) Provisional application No. 62/338,082, filed on May 18, 2016.

(51) Int. Cl.
*H01L 29/786* (2006.01)
*H01L 51/05* (2006.01)
*H01L 51/00* (2006.01)

(52) U.S. Cl.
CPC .......... *H01L 51/052* (2013.01); *H01L 51/004* (2013.01); *H01L 51/0003* (2013.01)

(58) Field of Classification Search
CPC combination set(s) only.
See application file for complete search history.

(56) References Cited

U.S. PATENT DOCUMENTS

| 2010/0063226 A1* | 3/2010 | Cho ...................... C08F 132/08 |
| | | 526/120 |
| 2012/0056183 A1* | 3/2012 | Mueller ................ C08F 232/00 |
| | | 257/57 |
| 2015/0270318 A1 | 9/2015 | Bhintade et al. |

FOREIGN PATENT DOCUMENTS

| JP | 2005314597 | * 11/2005 |
| WO | WO 2014/037076 A1 | 3/2014 |

OTHER PUBLICATIONS

Hui-Jing Han, et al., Photocrosslinkable Polynorbornene-based Block Copolymers with Enhanced Dielectric and Thermal Properties, Chinese J. Polym. Sci., vol. 34, No. 3, 378-389, (2016).
Syamkumar V. Mulpuri, et al., Synthesis and Characterization of Substituted Polynorbornene Derivatives, Polymer, 52, 4377-4386, (2011).

* cited by examiner

*Primary Examiner* — Monique R Peets
(74) *Attorney, Agent, or Firm* — Balaram Gupta

(57) ABSTRACT

The present invention relates to organic dielectric layers comprising a polycycloolefinic polymer with a pendent chromophoric group having an absorption maximum in the wavelength range from 230 to 290 nm, and to organic electronic devices comprising them.

16 Claims, 7 Drawing Sheets

ORGANIC DIELECTRIC LAYER AND ORGANIC ELECTRONIC DEVICE

CROSS REFERENCE TO RELATED APPLICATIONS

This application is a national phase application of PCT Application No. PCT/EP2017/061562, filed May 15, 2017, and published as International Publication No. WO 2017/198587 A1 on Nov. 23, 2017, and which claims the benefit of U.S. Provisional Application No. 62/338,082, filed May 18, 2016; both of which are incorporated herein by reference in their entirety.

TECHNICAL FIELD

The present invention relates to organic dielectric layers comprising a polycycloolefinic polymer with a pendent chromophoric group having an absorption maximum in the wavelength range from 230 to 290 nm, and to organic electronic devices comprising them.

BACKGROUND

In recent years there has been growing interest in organic electronic (OE) devices, for example organic thin film transistors (OTFT) for use in backplanes of display devices or logic capable circuits, organic photovoltaic (OPV) devices, organic photodetectors (OPD) or organic light emitting diodes (OLED).

A conventional OTFT has a gate electrode, a gate insulator layer made of a dielectric material (also referred to as "dielectric" or "gate dielectric"), source and drain electrodes, a semiconducting layer made of an organic semiconductor (OSC) material, and typically a passivation layer on top of the aforementioned layers to provide protection against environmental influence or against damage from subsequent device manufacturing steps.

Some patterning processes in OTFT fabrication use laser ablation to pattern materials, for example to form a via hole through a dielectric layer.

However, if the optical absorption coefficient of the dielectric material at the laser wavelength is not tuned appropriately, it is often difficult to obtain patterned features like via holes in good quality.

It is therefore desirable and advantageous to provide a dielectric material for use in a dielectric layer of an OE device which shows improved laser ablatability. At the same time the dielectric material should preferably exhibit further advantageous properties. Thus, the dielectric material should preferably have one or more of a low permittivity, a good orthogonality to the usually employed OSC material classes, a good solubility in organic solvents, especially in non-halogenated solvents, a good processability, especially for solution deposition methods, and a good availability by cost effective and easy synthesis methods which are also suitable for production at large scale. Preferably the dielectric material should also be crosslinkable to enable photopatterning and stack integration, for example by the formation of via interconnects to the S/D electrodes.

For use in OTFTs the dielectric material should also enable a good transistor performance and, in conjunction with the OSC material, give high mobility, high on currents, and low off currents.

The present invention enables satisfying the above needs by using a polycycloolefinic polymer in the dielectric layer of an OE device which contains a pendent group, for example an aromatic group like biphenyl, that has a high absorption at the wavelength typically used for laser ablation, especially in the UV range. Besides, the polycycloolefinic polymer is chemically inert, has an inherently low k, and can be further modified for example by adding pendent groups that impart solubility and/or crosslinking functionality.

SUMMARY

The present invention relates to an OE device comprising a dielectric layer, said dielectric layer comprising, or being obtained through the use of, a polycycloolefinic polymer comprising one or more pendent groups having an absorption maximum in the wavelength range from 230 to 290 nm, preferably in the range from 250 to 280 nm, very preferably in the range from 260 to 270 nm, hereinafter referred to as "pendent chromophoric group".

The invention further relates to a polycycloolefinic polymer comprising one or more pendent chromophoric groups.

The invention further relates to a dielectric layer in an OE device, said dielectric layer comprising, or being obtained through the use of, a polycycloolefinic polymer comprising one or more pendent chromophoric groups.

Other embodiments in accordance with the present invention encompass a process of preparing a dielectric layer in an OE device through the use of a polycycloolefinic polymer comprising one or more pendent chromophoric groups.

The aforementioned OE devices are, for example, Organic Thin Film Transistors (OTFT), Organic Light Emitting Diodes (OLED), Organic Photodetectors (OPD) or Organic Photovoltaic (OPV) devices. With regard to OTFTs, such devices are inclusive of both top gate and bottom gate OTFTs.

Embodiments of the present invention are also inclusive of products or assemblies encompassing an OE device as described above and below. Such products or assemblies being Integrated Circuits (IC), Radio Frequency Identification (RFID) tags, security markings or security devices containing an RFID tag, Flat Panel Displays (FPD), backplanes of FPDs, backlights of FPDs, electrophotographic devices, electrophotographic recording devices, organic memory devices, pressure sensors, optical sensors, chemical sensors, biosensors or biochips.

BRIEF DESCRIPTION OF THE DRAWINGS

Embodiments of the present invention are described below with reference to the following drawings.

DETAILED DESCRIPTION

Figure 1:
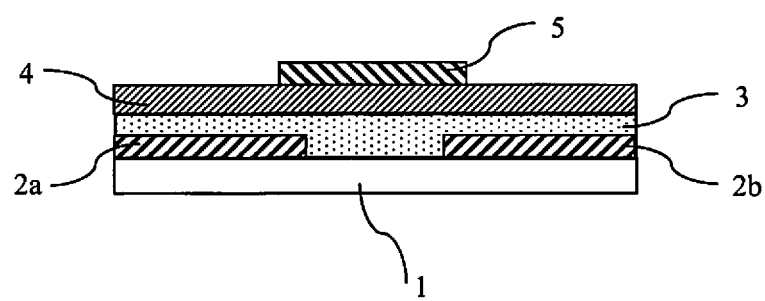
FIG. 1 is a schematic representation of a top gate OTFT device embodiment in accordance with the present invention.

As used herein, the term "chromophoric group" means a group having an absorption maximum in the range from 230 to 290 nm, preferably in the range from 250 to 280 nm, very preferably in the range from 260 to 270 nm. As used herein, the terms "chromophoric group" and "chromophore" are used interchangeably and mean a compound having an absorption maximum in the range from 230 to 290 nm, preferably in the range from 250 to 280 nm, very preferably in the range from 260 to 270 nm. The term "absorption maximum" means a peak in the absorption spectrum of the group or compound, wherein the said peak may be the only peak or one of several peaks, and is preferably the peak having the highest absorption value, in the absorption spectrum of the group or compound.

As used herein, the terms "dielectric" and "insulating" are used interchangeably. Thus reference to an insulating material or layer is inclusive of a dielectric material or layer. Further, as used herein, the term "organic electronic device" will be understood to be inclusive of the term "organic semiconductor device" and the several specific implementations of such devices, such as the OTFTs, are as defined above.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, small amounts of residues from initiators, catalysts and other elements attendant to the synthesis of such a polymer, where such residues are understood as not being covalently incorporated thereto. Further, while such residues, and other elements, are generally removed during post polymerization purification processes, trace amounts of such materials can be found to be mixed or co-mingled with the polymer such that they generally remain with the polymer when it is transferred between vessels or between solvents or dispersion media.

As used herein, the term "small molecule" will be understood to mean a monomeric compound which typically does not carry a reactive group by which it can be reacted to form a polymer, and which is designated to be used in monomeric form. In contrast thereto, the term "monomer", unless stated otherwise, will be understood to mean a monomeric compound that carries one or more reactive functional groups by which it can be reacted to form an oligomer or a polymer.

As used herein, the term "polymer composition" means at least one polymer and one or more other materials added to the at least one polymer to provide, or to modify, specific properties of the polymer composition and or the at least one polymer therein. It will be understood that a polymer composition is a vehicle for carrying the polymer to a substrate to enable the forming of layers or structures thereon. Exemplary materials include, but are not limited to, solvents, antioxidants, photoinitiators, photosensitizers, crosslinking moieties or agents, reactive diluents, acid scavengers, leveling agents and adhesion promoters. Further, it will be understood that a polymer composition may, in addition to the aforementioned exemplary materials, also encompass a blend of two or more polymers.

As defined herein, the terms "polycycloolefin", "polycyclic olefin", and "norbornene-type" are used interchangeably and refer to addition polymerizable monomers, or the resulting repeating unit, encompassing at least one norbornene moiety such as shown by either Structure A1 or A2, below. The simplest norbornene-type or polycyclic olefin monomer bicyclo[2.2.1]hept-2-ene (A1) is commonly referred to as norbornene.

(A1)

(A2)

However, the term "norbornene-type repeating unit" or "norbornene-type monomer", as used herein, is understood to not only mean norbornene itself but also to refer to any substituted norbornene, or substituted and unsubstituted higher cyclic derivatives thereof, for example of Structures B1 or B2, respectively shown below, wherein m is an integer of zero or greater, where m=zero being the norbornene monomer of formula A1 or its respective repeating unit of formula A2.

(B1)

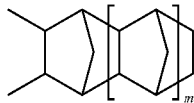

As used herein, the term "hydrocarbyl" refers to a radical or a group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, or I). The term perhalocarbyl refers to a hydrocarbyl group where each hydrogen has been replaced by a halogen. Non-limiting examples of hydrocarbyls, include, but are not limited to a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. Representative alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include but are not limited to ethenyl or vinyl, propenyl, butenyl and hexenyl. Representative alkynyl groups include but are not limited to ethynyl, 1-propynyl, 2-propynyl, 1 butynyl, and 2-butynyl. Representative cycloalkyl groups include but are not limited to cyclopentyl, cyclohexyl, and cyclooctyl substituents. Representative aryl groups include but are not limited to phenyl, biphenyl, indenyl naphthyl, and anthracenyl. Representative aralkyl groups include but are not limited to benzyl, phenethyl and phenbutyl.

As used herein, the term "halohydrocarbyl" is inclusive of the hydrocarbyl moieties mentioned above but where there is a degree of halogenation that can range from at least one hydrogen atom being replaced by a halogen atom (e.g., a fluoromethyl group) to where all hydrogen atoms on the hydrocarbyl group have been replaced by a halogen atom (e.g., trifluoromethyl or perfluoromethyl), also referred to as perhalogenation. For example, halogenated alkyl groups that can be useful in embodiments of the present invention can be partially or fully halogenated, alkyl groups of the formula $C_eX_{2e+1}$ wherein X is independently a halogen or a hydrogen and e is selected from an integer of 1 to 25. In some embodiments each X is independently selected from hydrogen, chlorine, fluorine bromine and/or iodine, preferably fluorine. In other embodiments each X is independently either hydrogen or fluorine. Thus, representative halohydrocarbyls and perhalocarbyls are exemplified by the aforementioned exemplary hydrocarbyls where an appropriate number of hydrogen atoms are each replaced with a halogen atom.

In addition, the definition of the terms "hydrocarbyl", "halohydrocarbyl", and "perhalohydrocarbyl", are inclusive of moieties where one or more of the carbons atoms is replaced by a heteroatom selected independently from O, N, P, or Si. Such heteroatom containing moieties can be referred to as, for example, either "heteroatom-hydrocarbyls" or "heterohydrocarbyls", including, among others, ethers, epoxies, glycidyl ethers, alcohols, carboxylic acids, esters, maleimides, amines, imines, amides, phenols, amidophenols, silanes, siloxanes, phosphines, phosphine oxides, phosphinites, phosphonites, phosphites, phosphonates, phosphinates, and phosphates.

Further exemplary hydrocarbyls, halohydrocarbyls, and perhalocarbyls, inclusive of heteroatoms, include, but are not limited to, —$(CH_2)_n$—Ar—$(CH_2)_n$—$C(CF_3)_2$—OH, —$(CH_2)_n$—Ar—$(CH_2)_n$—$OCH_2C(CF_3)_2$—OH, —$(CH_2)_n$—$C(CF_3)_2$—OH, —$((CH_2)_i$—O—$)_k$—$(CH_2)$—$C(CF_3)_2$—OH, —$(CH_2)_n$—$C(CF_3)(CH_3)$—OH, —$(CH_2)_n$—$C(O)NHR^*$, —$(CH_2)_n$—$C(O)Cl$, —$(CH_2)_n$—$C(O)OR^*$, —$(CH_2)_n$—$OR^*$, —$(CH_2)_n$—$OC(O)R^*$ and —$(CH_2)_n$—$C(O)R^*$, where n independently represents an integer from 0 to 12, i is 2, 3 or 4, k is 1, 2 or 3, Ar is aryl, for example phenyl, and $R^*$ independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl.

Exemplary perhalogenated alkyl groups include, but are not limited to, trifluoromethyl, trichloromethyl, —$C_2F_5$, —$C_3F_7$, —$C_4F_9$, $C_6F_{13}$, —$C_7F_{15}$, and —$C_{11}F_{23}$. Exemplary halogenated or perhalogenated aryl and aralkyl groups include, but are not limited to, groups having the formula —$(CH_2)_o$—$C_6F_pH_{5-o}$, and —$(CH_2)_o$—$C_6F_pH_{4-p}$-$pC_qF_rH_{2q+1-r}$, where o, p, r and q are independently selected integers from 0 to 5, 0 to 5, 0 to 9 and 1 to 4, respectively. Specifically, such exemplary halogenated or perhalogenated aryl groups include, but are not limited to, pentachlorophenyl, pentafluorophenyl, pentafluorobenzyl, 4-trifluoromethylbenzyl, pentafluorophenethyl, pentafluorophenpropyl, and pentafluorophenbutyl.

As used herein, the expression "optionally substituted" preferably means that one or more H atoms are optionally replaced by a group L, wherein L is selected from F, Cl, —OH, —CN, or straight-chain, branched or cyclic alkyl with 1 to 25, preferably 1 to 20, C atoms, in which one or more $CH_2$ groups are optionally replaced by —O—, —S—, —C(=O)—, —C(=S)—, —C(=O)—O—, —O—C(=O)—, —$NR^o$—, —$SiR^oR^{oo}$—, —$CF_2$—, —$CR^o$=$CR^{oo}$—, —$CY^1$=$CY^2$— or —C≡C— in such a manner that O and/or S atoms are not linked directly to one another, and in which one or more H atoms are optionally replaced by F, Cl, Br, I or CN, wherein $Y^1$ and $Y^2$ independently of each other denote H, F, Cl or CN, and $R^o$, $R^{oo}$ independently of each other denote H or straight-chain or branched alkyl with 1 to 20, preferably 1 to 12, C atoms that is optionally fluorinated. Preferred substituents L are selected from F, —CN, $R^o$, —$OR^o$, —$SR^o$, —C(=O)—$R^o$, —C(=O)—$OR^o$, —O—C(=O)—$R^o$, —O—C(O)—$OR^o$, —C(=O)—$NHR^o$, —C(=O)—$NR^oR^{oo}$. Very preferred substituents L are selected from F or alkyl, alkoxy, oxaalkyl, thiaalkyl, fluoroalkyl and fluoroalkoxy with 1 to 12 C atoms, or alkylcarbonyl, alkoxycarbonyl, alkylcarbonyloxy, alkenyl, fluoroalkenyl and alkynyl with 2 to 12 C atoms (including the carbonyl-C-atom).

As used herein, the terms "aralkyl" and "heteroaralkyl" mean an aryl or heteroaryl group, respectively, that is connected to an adjacent group via an alkylene (i.e. a divalent alkyl) group. Such groups can be expressed by the formula -alkylene-(hetero)aryl wherein "alkylene" means an alkylene group and "(hetero)aryl" means an aryl or heteroaryl group. An example for an aralkyl group is benzyl.

As used herein, the terms "aralkyloxy" and "heteroaralkyloxy" mean an aryl or heteroaryl group, respectively, that is connected to an adjacent group via an alkylencoxy (i.e. a divalent alkyloxy) group. Such groups can be expressed by the formula -alkylene-O-(hetero)aryl wherein "alkylene" means an alkylene group and "(hetero)aryl" means an aryl or heteroaryl group. An example for an aralkyloxy group is ethoxybiphenyl.

As will be discussed hereinafter, the use of a substituted monomer, in particular a substituted norbornene-type monomer, to form a polymer of the present invention allows for the properties of such embodiments to be tailored to fulfill the needs of individual applications. The procedures and methods that have been developed to polymerize monomers, in particular norbornene-type monomers, a variety of functional substituents, such as those described below, exhibit an outstanding flexibility and tolerance to various moieties and groups of the monomers. In addition to polymerization of monomers with a specific pendent group, monomers having a variety of distinct functionalities can be randomly polymerized to form a final material where the types and ratios of monomers used dictate the overall bulk properties of the resulting polymer.

Some preferred embodiments in accordance with the present invention encompass an OE device comprising a dielectric layer, said dielectric layer essentially consisting of a polycycloolefinic polymer, or of a polymer composition comprising such a polycycloolefinic polymer, comprising one or more pendent chromophoric groups.

Further preferred embodiments in accordance with the present invention encompass a polycycloolefinic polymer comprising one or more pendent chromophoric groups that is used for preparing a dielectric layer in an OE device.

In some preferred embodiments in accordance with the present invention, the polycycloolefinic polymer is soluble in non-fluorinated solvents, preferably in inert solvents, and is deposited from a solution in an inert, non-fluorinated solvent or solvent composition. The solvent or solvent composition provides good orthogonality to an underlying OSC layer and renders the polycycloolefinic polymer especially suitable for use as dielectric layer in a top gate OTFT device.

In some preferred polymer embodiments in accordance with the present invention, the polycycloolefinic polymer comprises one or more pendent chromophoric groups which are selected from $C_5$-$C_{25}$ aryl groups, $C_7$-$C_{25}$ aralkyl groups, $C_7$-$C_{25}$-aralkyoxy groups, $C_2$-$C_{25}$ heteroaryl groups, $C_5$-$C_{25}$ heteroaralkyl groups and $C_5$-$C_{25}$ heteroaralkyloxy groups, all of which are optionally substituted, preferably by one or more groups L as defined above. Examples of aryl groups include but are not limited to phenyl, 4-biphenyl, 2-indenyl, 1- or 2-naphthyl, 1-, 2- or 3-phenanthrenyl and 1-, 2- or 9-anthracenyl, all of which are optionally substituted, preferably by one or more groups L as defined above. Examples of aralkyl and aralkyloxy groups include but are not limited to methyl-4-biphenyl, ethyl-4-biphenyl, ethyl-2-indenyl and ethyloxy-2-biphenyl, all of which are optionally substituted, preferably by one or more groups L as defined above.

In some preferred polymer embodiments in accordance with the present invention, the polycycloolefinic polymer comprises one or more pendent chromophoric groups, and further comprises one or more alkyl or fluorinated alkyl groups having from 1 to 20, preferably from 1 to 12, C atoms. Such alkyl or fluorinated alkyl groups include, but are not limited to those of formula C $$-C_xF_yH_{2x+1-y}$$ C where x is an integer from 1 to 20, preferably from 1 to 12, and y is 0 or an integer from 1 to 2x+1, preferably 0 or an integer from 1 to 12, very preferably 0. Preferably such alkyl or fluorinated alkyl groups are selected from methyl, ethyl, propyl, butyl, pentyl, hexyl, heptyl, octyl, nonyl, decyl, undecyl, dodecyl, —$CF_3$, —$C_2F_5$, —$C_3F_7$, —$C_4F_9$, $C_6F_{13}$, —$C_7F_{15}$, —$C_{11}F_{23}$, more preferably from methyl, ethyl, butyl, hexyl, octyl and decyl.

In some preferred polymer embodiments in accordance with the present invention, the polycycloolefinic polymer comprises one or more pendent chromophoric groups, and further comprises one or more crosslinkable pendent groups.

In some preferred polymer embodiments in accordance with the present invention, the polycycloolefinic polymer comprises one or more pendent crosslinkable groups or moieties that have some degree of latency, hereinafter also referred to as "latent crosslinkable groups". By "latency", it is meant that such groups do not crosslink at ambient conditions or during the initial forming of the polymers, but rather crosslink when such reactions are specifically initiated, for example by actinic radiation or heat. Such latent crosslinkable groups are incorporated into the polymer backbone by, for example, providing one or more monomers encompassing such a pendent crosslinkable group, for example, a substituted or unsubstituted maleimide or maleimide containing pendent group, to the polymerization reaction mixture and causing the polymerization thereof. Preferred crosslinkable groups include a group comprising a substituted or unsubstituted maleimide portion, an epoxide portion, a vinyl portion, an acetyl portion, an indenyl portion, a cinnamate portion or a coumarin portion, and more specifically a group selected from a 3-monoalkyl- or 3,4-dialkylmaleimide, epoxy, vinyl, acetylene, cinnamate, indenyl or coumarin group.

The polycycloolefinic polymer, which is used in the dielectric layer, is preferably selected from norbornene-type polymers.

In some preferred polymer embodiments in accordance with the present invention, the norbornene-type polymers incorporate two or more distinct types of repeating units.

Other preferred polymer embodiments in accordance with the present invention encompass one or more norbornene-type polymers comprising one or more first, distinct types of repeating units of Formula I

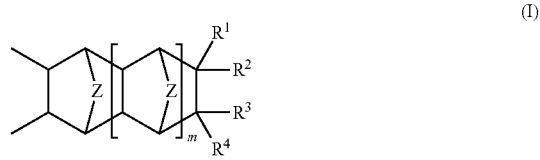

wherein Z is selected from —$CH_2$—, —$CH_2$—$CH_2$— or —O—, m is an integer from 0 to 5, each of $R^1$, $R^2$, $R^3$ and $R^4$ independently denote H, a $C_1$ to $C_{25}$ hydrocarbyl, a $C_1$ to $C_{25}$ halohydrocarbyl or a $C_1$ to $C_{25}$ prhalocarbyl group, and wherein in at least one repeating unit one or more, preferably only one, of $R^{1-4}$ is different from H and denotes or encompasses a chromophoric group.

The repeating units of Formula I are formed from the corresponding norbornene-type monomers of Formula Ia where Z, m and $R^{1-4}$ are as defined above:

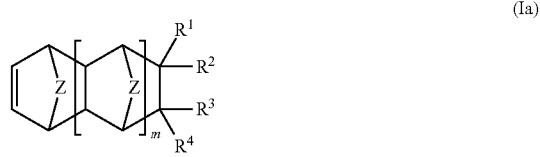

Some preferred polymer embodiments in accordance with the present invention encompass repeating units of Formula I and monomers of Formula Ia, where Z is —CH$_2$— and m is 0, 1 or 2. For other preferred embodiments Z is —CH$_2$— and m is 0 or 1, and for still other preferred embodiments Z is —CH$_2$— and m is 0.

Other preferred polymer embodiments of the present invention encompass repeating units of Formula I and monomers of Formula Ia where only one of R$^{1-4}$, for example R$^1$, is different from H, and the others of R$^{1-4}$ are H.

Other preferred polymer embodiments of the present invention encompass repeating units of Formula I and monomers of Formula Ia where those of R$^{1-4}$ that are different from H denotes a chromophoric group which is preferably selected from a C$_6$-C$_{25}$ aryl group, C$_7$-C$_{25}$ aralkyl group, C$_7$-C$_{25}$-aralkyoxy group, C$_2$-C$_{25}$ heteroaryl group, C$_5$-C$_{25}$ heteroaralkyl group and C$_5$-C$_{25}$ heteroaralkyloxy group, all of which are optionally substituted, preferably by one or more groups L as defined above. Preferred chromophoric groups R$^{1-4}$ of this embodiment are selected from formula A

—(CH$_2$)$_a$—(O)$_o$-aryl  A wherein a is 0 or an integer from 1 to 12, preferably an integer from 1 to 6, o is 0 or 1, and "aryl" denotes an aryl group with 6 to 20 C atoms, preferably selected from the subgroup consisting of phenyl, 4-biphenyl, 2-indenyl, 1- or 2-naphthyl, 1-, 2- or 3-phenanthrenyl and 1-, 2- or 9-anthracenyl, all of which are optionally substituted, preferably by one or more groups L as defined above.

Preferred polymer composition embodiments in accordance with the present invention encompass either a single norbornene-type polymer or a blend of two or more different norbornene-type polymers. Where such polymer composition embodiments encompass a single norbornene-type polymer, such polymer can be a homopolymer, that is to say a polymer encompassing only one type of repeating unit, or a copolymer, that is to say a polymer encompassing two or more distinct types of repeating units. Where such polymer composition embodiments encompass a blend of different polymers, "different" is understood to mean that each of the blended polymers encompasses at least one type of repeating unit, or combination of repeating units, that is distinct from any of the other blended polymers.

Other preferred polymer composition embodiments in accordance with the present invention encompass a blend of two or more different norbornene-type polymers, wherein at least one polymer comprises one or more first, distinct types of repeating units of Formula I

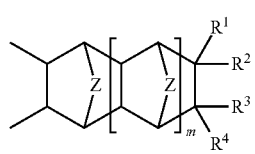

(I)

wherein Z is selected from —CH$_2$—, —CH$_2$—CH$_2$— or —O—, m is an integer from 0 to 5, each of R$^1$, R$^2$, R$^3$ and R$^4$ are independently selected from H, a C$_1$ to C$_{25}$ hydrocarbyl, a C$_1$ to C$_{25}$ halohydrocarbyl or a C$_1$ to C$_{25}$ perhalocarbyl group, and wherein at least one polymer comprises one or more distinct types of repeating units of formula I wherein one or more, preferably only one, of R$^{1-4}$ is different from H and denotes a chromophoric group, which is preferably selected from C$_6$-C$_{25}$ aryl, C$_7$-C$_{25}$ aralkyl, C$_7$-C$_{25}$-aralkyoxy, C$_2$-C$_{25}$ heteroaryl, C$_5$-C$_{25}$ heteroaralkyl and C$_5$-C$_{25}$ heteroaralkyloxy, all of which are optionally substituted, preferably by one or more groups L as defined above. Preferred chromophoric groups are selected from formula A and its preferred subgroups as defined above. Very preferred repeating units of Formula I of this preferred embodiment are selected from formulae 1-5 below.

The polymer and polymer composition embodiments in accordance with the present invention can advantageously be tailored to provide a distinct set of properties for each of many specific applications. That is to say that different combinations of norbornene-type monomers with several different types of pendent groups can be polymerized to provide norbornene-type polymers having properties that provide for obtaining control over properties such as flexibility, adhesion, dielectric constant, and solubility in organic solvents, among others. For example, varying the length of an alkyl pendent group can allow control of the polymer's modulus and glass transition temperature (T$_g$). Also, pendent groups selected from maleimide, cinnamate, coumarin, anhydride, alcohol, ester, and epoxy functional groups can be used to promote crosslinking and to modify solubility characteristics. Polar functional groups, epoxy and triethoxysilyl groups can be used to provide adhesion to metals, silicon, and oxides in adjacent device layers. Fluorinated groups, for example, can be used to effectively modify surface energy, dielectric constant and influence the orthogonality of the solution with respect to other materials.

Thus, further preferred polymer embodiments in accordance with the present invention encompass one or more norbornene-type polymers comprising one or more first, distinct types of repeating units of Formula I comprising a chromophoric group as defined above, and additionally comprising one or more second, distinct types of repeating units of Formula I

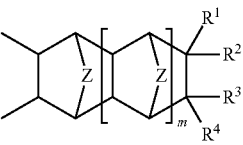

(I)

wherein Z is selected from —CH$_2$—, —CH$_2$—CH$_2$— or —O—, m is an integer from 0 to 5, each of R$^1$, R$^2$, R$^3$ and R$^4$ independently denote H, a C$_1$ to C$_{25}$ hydrocarbyl, a C$_1$ to C$_{25}$ halohydrocarbyl or a C$_1$ to C$_{25}$ perhalocarbyl group, and wherein one or more, preferably only one, of R$^{1-4}$ is different from H and denotes an alkyl or fluorinated alkyl group having from 1 to 20, preferably from 1 to 12, C atoms. Such alkyl or fluorinated alkyl groups include, but are not limited to those of the formula C

—C$_x$F$_y$H$_{2x+1-y}$  C where x is an integer from 1 to 20, preferably from 1 to 12, and y is 0 or an integer from 1 to 2x+1, preferably 0 or an integer from 1 to 12, very preferably 0. Preferred alkyl or fluorinated alkyl groups of formula C are selected from the subgroup consisting of methyl, ethyl, propyl, butyl, pentyl, hexyl, heptyl, octyl, nonyl, decyl, undecyl, dodecyl, —CF$_3$, —C$_2$F$_5$, —C$_3$F$_7$, —C$_4$F$_9$, C$_6$F$_{13}$, —C$_7$F$_{15}$, —C$_{11}$F$_{23}$, more preferably from the subgroup consisting of methyl, ethyl, butyl, hexyl, octyl and decyl.

Further preferred polymer embodiments in accordance with the present invention encompass one or more norbornene-type polymers comprising one or more first, distinct types of repeating units of Formula I comprising a chromophoric group as defined above, and additionally comprising one or more second, distinct types of repeating units of Formula I

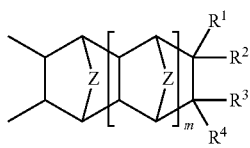

(I)

wherein Z is selected from —$CH_2$—, —$CH_2$—$CH_2$— or —O—, m is an integer from 0 to 5, each of $R^1$, $R^2$, $R^3$ and $R^4$ independently denote H, a $C_1$ to $C_{25}$ hydrocarbyl, a $C_1$ to $C_{25}$ halohydrocarbyl or a $C_1$ to $C_{25}$ perhalocarbyl group, and wherein one or more, preferably only one, of $R^{1-4}$ is different from H and denotes or encompasses a crosslinkable group. Preferred crosslinkable groups encompass a linking portion Lp and a functional portion Fp. Preferably Lp denotes or comprises a group selected from $C_1$-$C_{12}$ alkyls, aralkyls, aryls or hetero atom analogs. Further preferably Fp denotes or comprises one or more of a maleimide, a 3-monoalkyl- or 3,4-dialkylmaleimide, epoxy, vinyl, acetylenic, cinnamate, indenyl or coumarin moiety, which is capable of a crosslinking or 2+2 crosslinking reaction.

As used herein, the phrase "crosslinkable", when used to describe certain pendent groups, will be understood to mean a group that is reactive to actinic radiation and as a result of that reactivity enters into a crosslinking reaction, or a group that is not reactive to actinic radiation but can, in the presence of a crosslinking activator, enter into a crosslinking reaction.

In preferred polymer embodiments in accordance with the present invention, the norbornene-type polymers comprise one or more distinct types of first repeating units of formula I comprising a chromophoric group, which is selected from the group consisting of the following formulae:

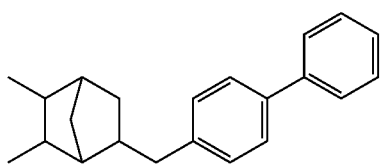

NBMePhPh

1

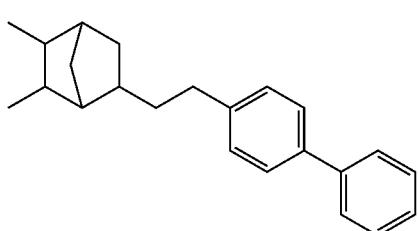

NBEtPhPh

2

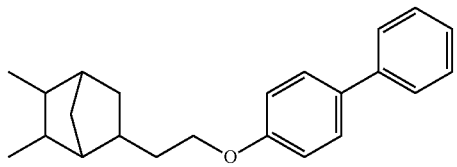

NBEtOparaPhPh

3

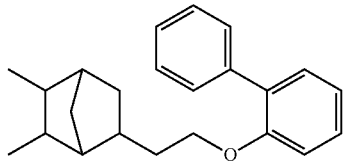

NBEtOorthoPhPh

3a

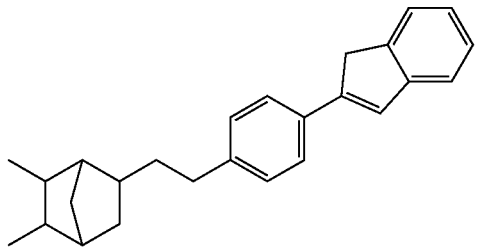

NBEtPhInd

4

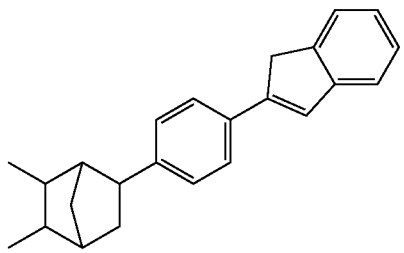

NBPhInd

5

In further preferred polymer embodiments in accordance with the present invention, the norbornene-type polymers comprise one or more distinct types of second repeating units of formula I comprising an alkyl group, which is selected from the group consisting of the following formulae:

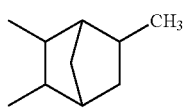

MethylNB

6

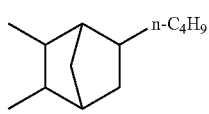

ButylNB

7

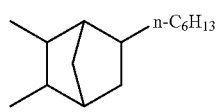

HexylNB

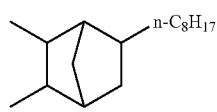

OctylNB

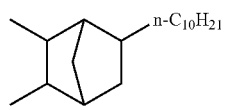

DecylNB

In further preferred polymer embodiments in accordance with the present invention, the norbornene-type polymers comprise one or more distinct types of second repeating units of formula I comprising a crosslinkable group, which is selected from the group consisting of the following formulae:

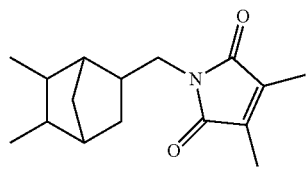

NBDMMIMe

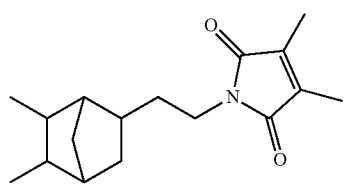

NBDMMIEt

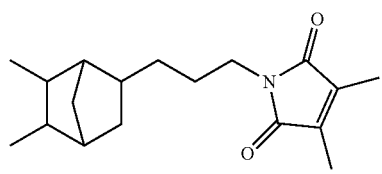

NBDMMIPr

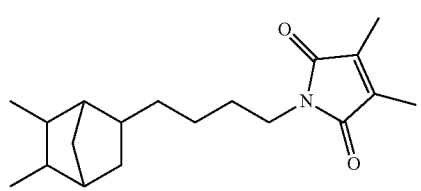

NBDMMIBu

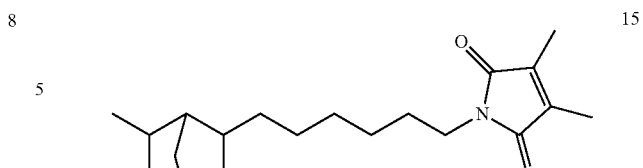

NBDMMIHx

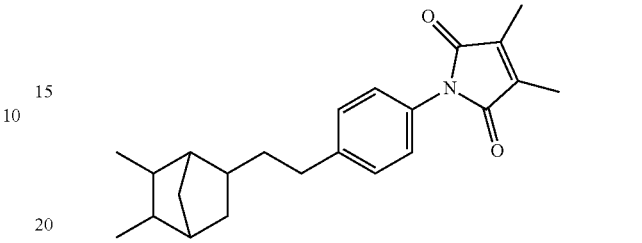

NBEtPhDMMI

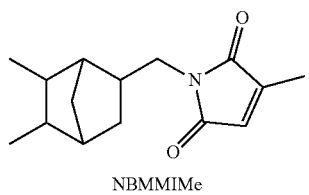

NBMMIMe

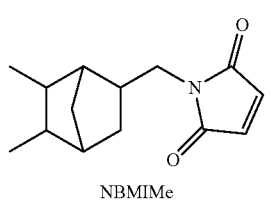

NBMIMe

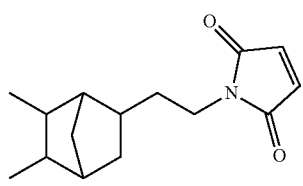

NBMIEt

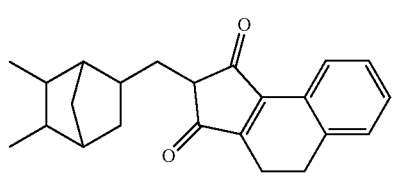

NBDHNMI

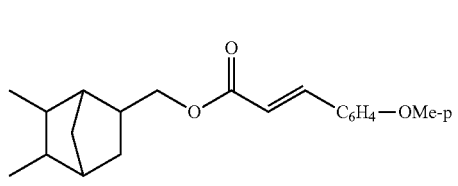

NBMeOCinn

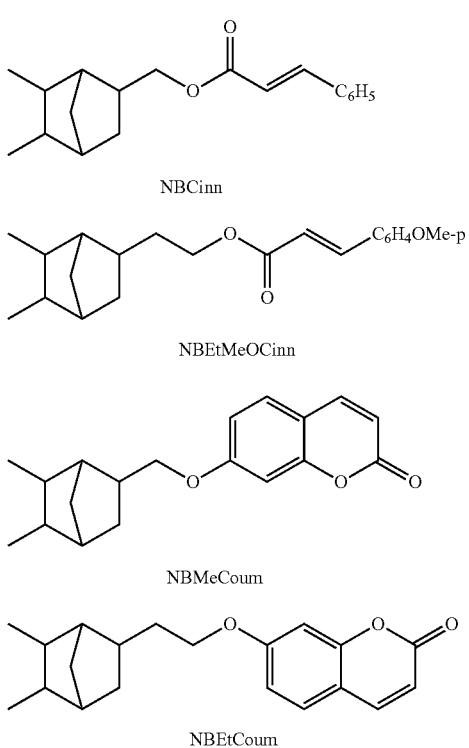

NBCinn (22)

NBEtMeOCinn (23)

NBMeCoum (24)

NBEtCoum (25)

In further preferred polymer embodiments in accordance with the present invention, the norbornene-type polymers comprise, and preferably consist of, one or more first, distinct types of repeating units of Formula I wherein one or more, preferably only one, of $R^{1-4}$ are different from H and denote or encompass a chromophoric group, and one or more second, distinct types of repeating units of Formula I wherein one or more, preferably only one, of $R^{1-4}$ are different from H, and denote or encompass an alkyl or fluoroalkyl group having from 1 to 20, preferably from 1 to 12, C atoms. Preferred chromophoric groups are selected from formula A and its preferred subgroups as defined above. Preferred alkyl or fluoroalkyl groups are selected from formula C and its preferred subgroups as defined above. Very preferred first repeating units of Formula I of this preferred embodiment are selected from formulae 1-5. Very preferred second repeating units of Formula I of this preferred embodiment are selected from formulae 6-10.

In further preferred polymer embodiments in accordance with the present invention, the norbornene-type polymers comprise, preferably consist of, one or more distinct types of first repeating units of formula I, wherein one or more, preferably only one, of $R^{1-4}$ are different from H and denote a chromophoric group that does not include a hetero atom. Preferred repeating units of this embodiment are selected from formula I wherein one or more of $R^{1-4}$ denote or encompass a chromophoric group selected from $C_6$-$C_{25}$ aryl and $C_7$-$C_{25}$ aralkyl which are optionally substituted, preferably by one or more groups L as defined above. Preferred chromophoric groups $R^{1-4}$ of this embodiment are those of formula B —$(CH_2)_a$-aryl    B wherein a is 0 or an integer from 1 to 12, preferably an integer from 1 to 6, very preferably 1, 2, 3 or 4, and "aryl" is an aryl group with 6 to 20 C atoms, preferably selected from the subgroup consisting of phenyl, 4-biphenyl, 2-indenyl, 1- or 2-naphthyl, 1-, 2- or 3-phenanthrenyl and 1-, 2- or 9-anthracenyl, all of which are optionally substituted, preferably by one or more groups L as defined above. Very preferred repeating units of this embodiment are those selected from formulae 1, 2, 4 and 5 above.

In further preferred polymer embodiments in accordance with the present invention, the norbornene-type polymers comprise, preferably consist of, one or more distinct types of first repeating units of formula I wherein one or more, preferably only one, of $R^{1-4}$ are different from H and denote a chromophoric group that does not include a hetero atom, and one or more second, distinct types of repeating units of Formula I wherein one or more, preferably only one, of $R^{1-4}$ are different from H and denote an alkyl or fluorinated alkyl group having from 1 to 20, preferably from 1 to 12, C atoms, and the others of $R^{1-4}$ denote H. Preferred chromophoric groups $R^{1-4}$ in the first repeating units are selected from $C_6$-$C_{25}$ aryl and $C_7$-$C_{25}$ aralkyl which are optionally substituted, preferably by one or more groups L as defined above, very preferably from formula B and its preferred subgroups as defined above. Preferred alkyl and fluoroalkyl groups $R^{1-4}$ in the second repeating units are selected from formula C and its preferred subgroups as defined above. Very preferred first repeating units of this embodiment are those selected from formulae 1, 2, 4 and 5. Very preferred second repeating units of this embodiment are those selected from formulae 6-10.

In other preferred polymer embodiments in accordance with the present invention, the norbornene-type polymers comprise, preferably consist of, one or more first, distinct types of repeating units of Formula I wherein one or more, preferably only one, of $R^{1-4}$ are different from H and denote or encompass a chromophoric group, and one or more second, distinct types of repeating units of Formula I wherein one or more, preferably only one, of $R^{1-4}$ are different from H and denote or encompass a crosslinkable group. Preferred crosslinkable groups encompass a linking portion Lp and a functional portion Fp. Preferably Lp denotes or comprises a group selected from $C_1$-$C_{12}$ alkyls, aralkyls, aryls or hetero atom analogs. Further preferably Fp denotes or comprises one or more of a maleimide, a 3-monoalkyl- or 3,4-dialkylmalcimide, epoxy, vinyl, acetylenic, cinnamate, indenyl or coumarin moiety, which is capable of a crosslinking or 2+2 crosslinking reaction. Very preferred repeating units of Formula I of this preferred embodiment are selected from formulae 11-25.

In other preferred polymer embodiments in accordance with the present invention, the norbornene-type polymers comprise, preferably consist of, one or more first, distinct types of repeating units of Formula I selected from formulae 1-5, and one or more second, distinct types of repeating units of Formula I selected from formulae 6-10.

In other preferred polymer embodiments in accordance with the present invention, the norbornene-type polymers comprise, preferably consist of, one or more first, distinct types of repeating units of Formula I selected from formulae 1-5, and one or more second, distinct types of repeating units of Formula I selected from formulae 11-25.

In other preferred polymer embodiments in accordance with the present invention, the norbornene-type polymers do not contain a repeating unit comprising a crosslinkable group.

In some preferred polymer embodiments that encompass polymers having a first and a second distinct type of repeating units in accordance with Formula I, the ratio of such first and second type of repeating units is from 95:5 to 5:95. In other preferred embodiments the ratio of such first and second type of repeating units is from 80:20 to 20:80. In still other preferred embodiments the ratio of such first and second type of repeating units is from 60:40 to 40:60. In still other preferred embodiments the ratio of such first and second type of repeating units is from 55:45 to 45:55.

While Formula I and Ia, as well as each of the subformulae and generic formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that preferred embodiments of the present invention are made to take advantage of such differences by using monomers that are either a mixture of isomers that is rich in either the exo- or endo-isomer, or are essentially the pure advantageous isomer.

Examples of suitable norbornene monomers, polymers and methods for their synthesis are provided herein and can also be found in pertinent parts of U.S. Pat. No. 6,455,650, US 2011/0104614 A1, US 2007/0066775 A1, US 2008/0194740 A1, US 2012/0056249 A1 and US 2012/0056183 A1, pertinent parts of which are incorporated into this application by reference. For example, exemplary polymerizations processes employing Group VIII transition metal catalysts are also described in a few of the aforementioned references and are further described hereinbelow.

The polymer embodiments of the present invention are formed having a weight average molecular weight ($M_w$) that is appropriate to their use. Generally, a $M_w$ from 5,000 to 500,000 is found appropriate for some embodiments, while for other embodiments other $M_w$ ranges can be advantageous. For example, in some preferred embodiments, the polymer has a $M_w$ of at least 10,000, while in other preferred embodiments the polymer has a $M_w$ of at least 20,000. In other preferred embodiments, the upper limit of the polymer's $M_w$ can be up to 400,000, while in other preferred embodiments the upper limit of the polymer's $M_w$ can be up to 250,000. It will be understood that since an appropriate $M_w$ is a function of the desired physical properties in the cured polymer, films, layers or structures derived therefrom, it is a design choice and thus any $M_w$ within the ranges provided above is within the scope of the present invention. In the polymers of the present invention, the total number of repeating units d is preferably from 2 to 10,000. The total number of repeating units d is preferably ≥5, very preferably ≥10, most preferably ≥50, and preferably ≤500, very preferably ≤1,000, most preferably ≤2,000, including any combination of the aforementioned lower and upper limits of d.

In some preferred embodiments of the present invention, crosslinkable or crosslinked polycycloolefinic polymers are used as bank structure material or as a component thereof. It has been found that such crosslinkable or crosslinked polymers can serve to improve one or more properties selected from structural integrity, durability, mechanical resistivity and solvent resistivity of the gate dielectric layer and the electronic device. Suitable crosslinkable polymers are for example those having one or more repeating units of Formula I, wherein one or more of $R^{1-4}$ denotes a crosslinkable group as listed above.

For crosslinking, the polymer, generally after deposition thereof, is exposed to electron beam or electromagnetic (actinic) radiation such as X-ray, UV or visible radiation, or heated if it contains thermally crosslinkable groups. For example, actinic radiation may be employed to image the polymer using a wavelength of from 11 nm to 700 nm, such as from 200 to 700 nm. A dose of actinic radiation for exposure is generally from 25 to 15000 mJ/cm². Suitable radiation sources include mercury, mercury/xenon, mercury/halogen and xenon lamps, argon or xenon laser sources, x-ray. Such exposure to actinic radiation is to cause crosslinking in exposed regions. Although other repeating unit pendent groups that crosslink can be provided, generally such crosslinking is provided by repeating units that encompass a maleimide pendent group, that is to say one of R' to R' is a substituted or unsubstituted maleimide moiety. If it is desired to use a light source having a wavelength outside of the photo-absorption band of the maleimide group, a radiation sensitive photosensitizer can be added. If the polymer contains thermally crosslinkable groups, optionally an initiator may be added to initiate the crosslinking reaction, for example in case the crosslinking reaction is not initiated thermally.

In other preferred embodiments in accordance with the present invention, the crosslinkable polymer composition comprises a stabilizer material or moiety to prevent spontaneous crosslinking and improve shelf life of the polymer composition. Suitable stabilizers are antioxidants such as catechol or phenol derivatives that optionally contain one or more bulky alkyl groups, for example t-butyl groups, in ortho-position to the phenolic OH group.

In order to improve the processing of the individual device components, including functional layers, and the integrity of the electronic device, it is desirable to decrease the time needed for the process while keeping or improving the physical properties of the components being formed. This can be maintained where subsequent components and solvents used in forming such components are orthogonal and thus do not dissolve each other. Where such orthogonality is difficult to obtain, crosslinking, typically UV crosslinking, a first component to make such first component insoluble with respect to the polymer composition of a second component will prevent any influence of the properties of either component on the other component.

Shortening the time needed for the processing can be done for example by tuning the coating process, while decreasing the time needed for UV crosslinking can be achieved both by chemical adjustment of the polymer or by changes in the process.

However, chemical modifications of polymers are limited, because the UV sensitivity is related to certain properties of the polymer, and for example changes towards increased UV sensitivity may decrease the solubility. Changing the process, for example, by using higher power UV, could increase the possibility of creating an ozone atmosphere and thus cause undesired changes in the surface of the polymer dielectric.

Therefore, some preferred embodiments in accordance with the present invention encompass polymer compositions comprising one or more crosslinker additives. Such additives comprise two or more functional groups that are capable of reacting with the pendent crosslinkable groups of the polycycloolefinic polymer used to form the bank structure. It will also be understood that the use of such crosslinker additives can also enhance the crosslinking of the aforementioned polymer.

In some preferred embodiments in accordance with the present invention, crosslinking can be achieved by exposure to UV radiation.

The use of a crosslinker enhances the ability to pattern the bank structures through the use of an imagewise exposure to an appropriate wavelength and dose of UV radiation.

In some preferred embodiments in accordance with the present invention the crosslinkable group of the crosslinker is selected from a maleimide, a 3-monoalkyl-maleimide, a 3,4-dialkylmaleimide, an epoxy, a vinyl, an acetylene, an indenyl, a cinnamate or a coumarin group, or a group that comprises a substituted or unsubstituted maleimide portion, an epoxide portion, a vinyl portion, an acetylene portion, an indenyl portion, a cinnamate portion or a coumarin portion.

In some preferred embodiments in accordance with the present invention, the crosslinker is selected of formula III1 or III2

$$P\text{-}A''\text{-}X'\text{-}A''\text{-}P \qquad \text{III1}$$

$$H_{4-c}C(A''\text{-}P)_c \qquad \text{III2}$$

wherein X' is O, S, NH or a single bond, A" is a single bond or a connecting, spacer or bridging group, which is selected from $(CZ_2)_n$, $(CH_2)_n\text{—}(CH=CH)_p\text{—}(CH_2)_n$, $(CH_2)_n\text{—}O\text{—}(CH_2)_n$, $(CH_2)_n\text{—}C_6Q_{10}\text{-}(CH_2)_n$, and $C(O)$, where each n is independently an integer from 0 to 12, p is an integer from 1-6, Z is independently H or F, $C_6Q_{10}$ is cyclohexyl that is substituted with Q, Q is independently H, F, $CH_3$, $CF_3$, or $OCH_3$, P is a crosslinkable group, and c is 2, 3, or 4, and where in formula III1 at least one of X' and the two groups A" is not a single bond.

In some preferred embodiments P is selected from a maleimide, a 3-monoalkyl-maleimide, a 3,4-dialkylmaleimide, an epoxy, a vinyl, an acetylene, an indenyl, a cinnamate or a coumarin group, or comprises a substituted or unsubstituted maleimide portion, an epoxide portion, a vinyl portion, an acetylene portion, an indenyl portion, a cinnamate portion or a coumarin portion.

Preferred compounds of formula III1 are selected from formula C1:

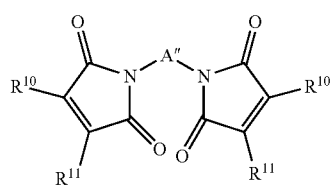

C1 wherein $R^{10}$ and $R^{11}$ are independently of each other H or a $C_1$-$C_6$ alkyl group, and A" is as defined in formula III1. In one embodiment of this invention, the crosslinkers are selected from DMMI-butyl-DMMI, DMMI-pentyl-DMMI and DMMI-hexyl-DMMI, wherein "DMMI" means 3,4-dimethylmaleimide.

In some preferred embodiments the spacer group A" denotes linear $C_1$ to $C_{30}$ alkylene or branched $C_3$ to $C_{30}$ alkylene or cyclic $C_5$ to $C_{30}$ alkylene, each of which is unsubstituted or mono- or polysubstituted by F, Cl, Br, I or CN, wherein optionally one or more non-adjacent $CH_2$ groups are replaced, in each case independently from one another, by —O—, —S—, —NH—, —NR$^{18}$—, —SiR$^{18}$R$^{19}$—, —C(O)—, —C(O)O—, —OC(O)—, —OC(O)—O—, —S—C(O)—, —C(O)—S—, —CH=CH— or —C≡C— in such a manner that O and/or S atoms are not linked directly to one another, $R^{18}$ and $R^{19}$ are independently of each other H, methyl, ethyl or a $C_3$ to $C_{12}$ linear or branched alkyl group.

Preferred groups A" are —$(CH_2)_r$—, —$(CH_2CH_2O)_s$, $CH_2CH$, —$CH_2CH_2$—S—$CH_2CH_2$— or —$CH_2CH_2$—NH—$CH_2CH_2$— or —$(SiR^{18}R^{19}$—O)$_r$—, with r being an integer from 2 to 12, s being 1, 2 or 3 and $R^{18}$ and $R^{19}$ having the meanings given above.

Further preferred groups A" are selected from methylene, ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene.

The synthesis of crosslinkers like those of formula C1 is disclosed for example in U.S. Pat. No. 3,622,321.

In some preferred embodiments in accordance with the present invention the polymer composition comprises a crosslinkable polycycloolefinic polymer and a reactive adhesion promoter. The reactive adhesion promoter comprises a first functional group which is a surface-active group that is capable of interactions, for example chemical bonding, with the substrate on which the bank structures are provided, and a second functional group that is capable of interactions, either with or without forming a chemical bond, with the polycycloolefinic polymer, for example by crosslinking with a pendent crosslinkable group in the polycycloolefinic polymer. The adhesion promoter may be used especially if a photolithography process is employed when providing the bank structures or further functional layers.

In some preferred embodiments in accordance with the present invention, the adhesion promoter is a compound of formula IV $$G^1\text{-}A''\text{-}G^2 \qquad \text{IV}$$

wherein $G^1$ is a surface-active group, for example a silane or silazane group, A" is a single bond or a connecting, spacer or bridging group, for example as defined in formula III1 above, and $G^2$ is a crosslinkable group, for example as defined in formula III1 above, or $G^2$ is a non-reactive compatibilizing group for the polycycloolefinic polymer. As used herein, the term "compatibilizing" will be understood to mean an interfacial agent or group that facilitates the formation of uniform blends of normally immiscible polymers. For example, if the polycycloolefinic polymer comprises a halogenated or perhalogenated portion, like for example in monomers 15 to 26, the compatibilizing group $G^2$ may be selected from a halogenated or perhalogenated alkyl, aryl or aralkyl group.

In some preferred embodiments $G^1$ is a group of the formula —Si$R^{12}R^{13}R^{14}$, or a group of the formula —NH—Si$R^{12}R^{13}R^{14}$, wherein $R^{12}$, $R^{13}$ and $R^{14}$ are each independently selected from halogen, silazane, $C_1$-$C_{12}$-alkoxy, $C_1$-$C_{12}$-alkylamino, optionally substituted $C_6$-$C_{20}$-aryloxy and optionally substituted $C_2$-$C_{20}$-heteroaryloxy, and wherein one or two of $R^{12}$, $R^{13}$ and $R^{14}$ may also denote $C_1$-$C_{12}$-alkyl, optionally substituted $C_6$-$C_{20}$-aryl or optionally substituted $C_2$-$C_{20}$-heteroaryl.

In other preferred embodiments $G^2$ is a crosslinkable group selected from a maleimide, a 3-monoalkyl-maleimide, a 3,4-dialkylmaleimide, an epoxy, a vinyl, an acetyl, an indenyl, a cinnamate or a coumarin group, or comprises a substituted or unsubstituted maleimide portion, an epoxide portion, a vinyl portion, an acetyl portion, an indenyl portion, a cinnamate portion or a coumarin portion.

In other preferred embodiments, $G^2$ is a non-reactive, compatibilizing group selected from a $C_1$-$C_{11}$ halogenated or perhalogenated alkyl, a $C_6$-$C_{14}$ halogenated or perhalogenated aryl, or a halogenated or perhalogenated $C_7$-$C_{14}$ aralkyl, more specifically from a $C_1$-$C_{11}$ alkyl, a $C_6$-$C_{14}$ aryl or a $C_7$-$C_{14}$ aralkyl, each of which is fluorinated or perfluorinated. In other embodiments $G^2$ is selected from —$C_4F_9$, —$(CH_2)_b$—$C_6F_5$, —$CH_2C_6F_2$, —$CH_2$—$C_2F_5$, —$CH_2CH_2$—$C_4F_9$, —$CH_2$—$(CF_2)_3$—$CF_2H$, —$CH_2CF_2CF_2H$, —$C_7F_{15}$ or $CF_2CFHOC_3F_7$, wherein b is an integer from 1 to 6.

In other preferred embodiments A" is selected from $(CZ_2)_n$, $(CH_2)_n$—$(CH=CH)_p$—$(CH_2)_n$, $(CH_2)_n$—O, $(CH_2)_n$—O—$(CH_2)_n$, $(CH_2)_n$—$C_6Q_4$-$(CH_2)_n$, $(CH_2)_n$—$C_6Q_{10}$-$(CH_2)_n$ and C(O)—O, where each n is independently an integer from 0 to 12, p is an integer from 1-6, Z is independently H or F, $C_6Q_4$ is phenyl that is substituted with Q, $C_6Q_{10}$ is cyclohexyl that is substituted with Q, Q is independently H, F, $CH_3$, $CF_3$ or $OCH_3$.

Preferred compounds of formula IV are selected from formula A1:

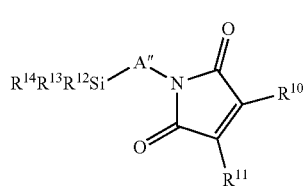

A1 where $R^{12}$, $R^{13}$ $R^{14}$, and A" are as defined above, and $R^{10}$ and $R^{11}$ are each independently H or a $C_1$-$C_6$ alkyl group. Suitable compounds of formula A1 are for example DMMI-propyl-Si(OEt)$_3$, DMMI-butyl-Si(OEt)$_3$, DMMI-butyl-Si(OMe)$_3$, DMMI-hexyl-Si(OMe)$_3$, wherein "DMMI" means 3,4-dimethylmaleimide.

Other preferred embodiments in accordance with the present invention relate to a composition encompassing the polycycloolefinic polymer and a casting or printing solvent as already described hereinabove and hereinbelow.

In some preferred composition embodiments in accordance with the present invention the solvent is selected from organic solvents as described hereinbelow and hereinabove. In other embodiments the solvent includes, without limitation, cyclohexylbenzene, mesitylene, indan, xylene, tetralin, diethylbenzene, cyclopentanone, benzyl acetate or combinations of the aforementioned.

In other preferred composition embodiments in accordance with the present invention the concentration of the polycycloolefinic polymer in the composition is from 0.1% to 20%, preferably from 0.5% to 10%, and very preferably from 1% to 5%.

The aforementioned concentration values refer to the composition encompassing the solvent(s) and all solid components such as the polycycloolefinic polymer.

Preferred OE device embodiments in accordance with the present invention include, without limitation, organic thin film transistors (OTFTs), which can be top gate or bottom gate transistors, Organic Light Emitting Diodes (OLED), Organic Photodetecting (OPD) Devices or Organic Photovoltaic (OPV) Devices.

Some preferred OE device embodiments in accordance with the present invention can be, for example, OTFTs where the OSC is used as the active channel material, OPV or OPD devices where the OSC is used as charge carrier material, or organic rectifying diodes (ORDs) where the OSC is a layer element of such a diode. OSCs for such embodiments can be deposited by any of the previously discussed deposition methods, but as they are generally deposited or formed as blanket layers, solvent coated methods such as spray-, dip-, web- or spin-coating, or printing methods such as ink-jet printing, flexo printing or gravure printing, are typically employed to allow for ambient temperature processing.

In some preferred OE device embodiments the OE device is a bottom gate or top gate OTFT encompassing a gate dielectric layer encompassing a polycycloolefinic polymer as described above and below.

In other preferred OE device embodiments the OE device is a bottom gate or top gate OTFT encompassing a passivation layer encompassing a polycycloolefinic polymer as described above and below.

Other preferred embodiments in accordance with the present invention relate to a process of preparing an OE device encompassing a dielectric or passivation layer comprising a polycycloolefinic polymer as described above and below, said OE device further encompassing an OSC layer being obtained by solution deposition of an OSC material.

Other preferred embodiments of the present invention relate to a process of preparing an OE device, encompassing the following steps in an appropriate sequence:

a) depositing an OSC material, preferably from an organic solution, to form an OSC layer,
b) depositing source and drain electrodes,
c) depositing a gate electrode,
b) depositing a polycycloolefinic polymer as described above and below, preferably from an organic solution, to form a dielectric layer.

Figure 2:
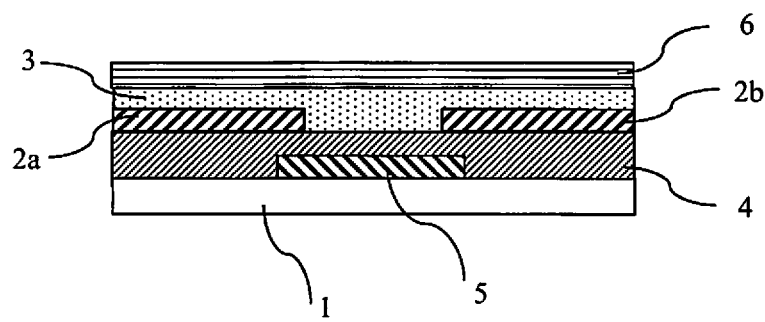
FIG. 2 is a schematic representation of a bottom gate OTFT device embodiment in accordance with the present invention.

A top gate OTFT in accordance with one preferred embodiment of the present invention is depicted schematically in FIG. 1, and a bottom gate OTFT in accordance with another embodiment of the present invention is depicted schematically in FIG. 2.

Turning now to FIG. 1, a schematic and simplified representation of a top gate OTFT device in accordance with a preferred embodiment of the present invention is provided. Such OTFT device includes a substrate (1), source and drain electrodes (2a, 2b), an OSC layer (3), a dielectric layer (4) encompassing a polycycloolefinic polymer as described above and below and serving as gate insulator, and a gate electrode (5).

Other preferred embodiments in accordance with the present invention relate to a process for preparing a top gate OTFT device, for example, as illustrated in FIG. 1, by a process encompassing:

a) forming source and drain electrodes (2a,2b) on a substrate (1),
b) forming an OSC layer (3) by deposition of an OSC material, preferably from an organic solution, on the source and drain electrodes (2a,2b),
c) forming a dielectric layer (4) by deposition of a polycycloolefinic polymer as described above and below, preferably from an organic solution, on the OSC layer (3),
d) forming a gate electrode (5) on the dielectric layer (4).

Turning now to FIG. 2, a schematic and simplified representation of a bottom gate OTFT device in accordance with another preferred embodiment of the present invention is provided. Such OTFT device includes a substrate (1), a gate electrode (5), a dielectric layer (4) comprising a polycycloolefinic polymer as described above and below serving as gate insulator, source and drain electrodes (2a, 2b), an OSC layer (3), and optionally a passivation layer (6).

Other preferred embodiments in accordance with the present invention relate to a process for preparing a bottom gate OTFT device, for example, as illustrated in FIG. 2, by a process encompassing:

a) forming a gate electrode (5) on a substrate (1), b) forming a dielectric layer (4) by deposition of a polycycloolefinic polymer as described above and below, preferably from an organic solution, on the substrate (1) and the gate electrode (5), c) forming source and drain electrodes (2a, 2b) on the dielectric layer (4).

d) forming an OSC layer (3) by deposition of an OSC material, preferably from an organic solution, on the source and drain electrodes (2a, 2b) and the dielectric layer (4), e) optionally forming a passivation layer (6) by deposition of a dielectric material on the OSC layer (3).

In the aforementioned processes, the electrodes (2a, 2b, 5) are for example applied onto the substrate (1) or the dielectric layer (4) by a sputtering process, and can be patterned by etching and/or lithographic patterning. The OSC layer (3) and dielectric layer (4) can be applied by a coating or printing process as described above.

The other components or functional layers of the OE and OTFT devices, like the substrate and the gate, source and drain electrodes, can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

Generally, the thickness of a functional layer, for example a gate dielectric or OSC layer, in some preferred OE and OTFT device embodiments in accordance with the present invention is from 0.001 (in case of a monolayer) to 10 µm. In some other preferred embodiments such thickness ranges from 0.001 to 1 µm, and in still other preferred embodiments from 5 nm to 500 nm, although other thicknesses or ranges of thickness are contemplated and thus are within the scope of the present invention.

Various substrates may be used for the fabrication of the OE device embodiments of the present invention. For example, glass or polymeric materials are most often used. Suitable and preferred polymeric materials include, but are not limited to, alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced plastic, fluorocarbon polymers, hexafluoropropylene-vinylidene-fluoride copolymer, high density polyethylene, parylene, polyamide, polyimide, polyaramid, polydimethylsiloxane, polyethersulfone, poly-ethylene, polyethylenenaphthalate, polyethyleneterephthalate, polyketone, polymethylmethacrylate, polypropylene, polystyrene, polysulfone, polytetrafluoroethylene, polyurethanes, polyvinylchloride, polycycloolefin, silicone rubbers, and silicones, where polyethyleneterephthalate, polyimide, polycycloolefin and polyethylenenaphthalate materials have been found most appropriate. Additionally, for some preferred embodiments of the present invention the substrate can be any suitable material, for example, plastic, metal or glass material coated with one or more of the above listed materials. It will be understood that in forming such a substrate, methods, such as, extruding, stretching, rubbing or photochemical techniques can be employed to provide a homogeneous surface for device fabrication as well as to provide pre-alignment of an organic semiconductor material in order to enhance carrier mobility therein.

In one embodiment, the substrate is a polymer film of a polymer selected from the group consisting of polyesters, polyimides, polyarylates, polycycloolefins, polycarbonates and polyethersulphones.

In other embodiments, polyester substrates, most preferably polyethylene terephthalate (PET) or polyethylene naphthalate (PEN), for example PET films of the Melinex® series or PEN films of the Teonex® series, both from DuPont Teijin Films™ may be used.

The gate, source and drain electrodes in the OTFT device embodiments in accordance with the present invention can be deposited or formed by liquid coating, such as spray-, dip-, web- or spin-coating, or by vacuum deposition methods including but not limited to physical vapor deposition (PVD), chemical vapor deposition (CVD) or thermal evaporation methods. Suitable electrode materials and deposition methods are known to the person skilled in the art. Suitable electrode materials include, without limitation, inorganic or organic materials, or composites of the two. Exemplary electrode materials include polyaniline, polypyrrole, poly(3, 4-ethylenedioxy-thiophene) (PEDOT) or doped conjugated polymers, further dispersions or pastes of graphite or particles of metal such as Au, Ag, Cu, Al, Ni or their mixtures as well as sputter coated or evaporated metals such as Cu, Cr, Pt/Pd, Ag, Au or metal oxides such as indium tin oxide (ITO) F-doped ITO or Al-doped ZnO. Organometallic precursors can also be used and deposited from a liquid phase.

The organic semiconductor materials and methods for applying the organic semiconductor layer for OTFT embodiments in accordance with the present invention can be selected from standard materials and methods known to the person skilled in the art, and are described in the literature. The organic semiconductor can be an n- or p-type OSC, which can be deposited by PVD, CVD or solution deposition methods. Effective OSCs exhibit a field effect mobility of greater than $1\times10^{-5}$ $cm^2V^{-1}s^{-1}$.

OSC embodiments in accordance with the present invention can be either OTFTs where the OSC is used as the active channel material, OPV devices where the OSC is used as charge carrier material, or organic rectifying diodes (ORDs) where the OSC is a layer element of such a diode. OSCs for such embodiments can be deposited by any of the previously discussed deposition methods, but as they are generally deposited or formed as blanket layers, solvent coated methods such as spray-, dip-, web- or spin-coating, or printing methods such as ink-jet printing, flexo printing or gravure printing, are typically employed to allow for ambient temperature processing. However, OSCs can be deposited by any liquid coating technique, for example ink-jet deposition or via PVD or CVD techniques.

For some OTFT embodiments, the semiconducting layer that is formed can be a composite of two or more of the same or different types of organic semiconductors. For example, a p-type OSC material may, for example, be mixed with an n-type material to achieve a doping effect of the layer. In some embodiments of the invention, multilayer organic semiconductor layers are used. For example an intrinsic organic semiconductor layer can be deposited near the gate dielectric interface and a highly doped region can additionally be coated adjacent to such an intrinsic layer.

The OSC material employed for device embodiments in accordance with the present invention can be any conjugated molecule, for example, an aromatic molecule containing two or more, more specifically at least three aromatic rings. In some preferred OSC embodiments of the present invention, the OSC contains aromatic rings selected from 5-, 6- or 7-membered aromatic rings, while in other preferred embodiments the OSC contains aromatic rings selected from 5- or 6-membered aromatic rings. The OSC material can be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings can be optionally substituted with fluoro, cyano, alkyl, alkoxy, polyalkoxy, thioalkyl, silyl, ethynylsilyl, optionally substituted secondary or tertiary alkylamine or arylamine, aryl or substituted aryl groups, wherein ethynylsilyl groups are represented by —C≡C—SiR'R"R"', and substituted secondary or tertiary alkylamine or arylamine are represented by —N(R')(R"), wherein R' and R" are each independently H, optionally fluorinated $C_{1-12}$ alkyl or optionally fluorinated $C_{6-10}$ aryl.

The aforementioned aromatic rings can be fused rings or linked with a conjugated linking group such as —C(T')═C(T")—, —C≡C—, —N(R"")—, —N═N—, —(R") C═N—, —N—C(R")—, where T and T" each independently represent H, Cl, F, —C≡N or lower alkyl groups such as $C_{1-4}$ alkyl groups and R" is as defined above.

In some preferred electronic device embodiments of the present invention, OSC materials that can be used include compounds, oligomers and derivatives of compounds selected from the group consisting of conjugated hydrocarbon polymers such as polyacene, polyphenylene, poly(phenylene vinylene), polyfluorene including oligomers of those conjugated hydrocarbon polymers; condensed aromatic hydrocarbons, such as, tetracene, chrysene, pentacene, pyrene, perylene, coronene, or soluble, substituted derivatives of these; oligomeric para substituted phenylenes such as p-quaterphenyl (p-4P), p-quinquephenyl (p-5P), p-sexiphenyl (p-6P), or soluble substituted derivatives of these; conjugated heterocyclic polymers such as poly(3-substituted thiophene), poly(3,4-bisubstituted thiophene), optionally substituted polythieno[2,3-b]thiophene, optionally substituted polythieno[3,2-b]thiophene, poly(3-substituted selenophene), polybenzothiophene, polyisothianaphthene, poly(N-substituted pyrrole), poly(3-substituted pyrrole), poly(3,4-bisubstituted pyrrole), polyfuran, polypyridine, poly-1,3,4-oxadiazoles, polyisothianaphthenc, poly(N-substituted aniline), poly(2-substituted aniline), poly(3-substituted aniline), poly(2,3-bisubstituted aniline), polyazulene, polypyrene; pyrazoline compounds; polyselenophene; polybenzofuran; polyindole; polypyridazine; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalenetetracarboxylic diimide and fluoro derivatives; N,N'-dialkyl, substituted dialkyl, diaryl or substituted diaryl 3,4,9,10-perylenetetracarboxylicdiimide; bathophenanthroline; diphenoquinones; 1,3,4-oxadiazoles; 11,11,12,12-tetracyanonaptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Where a liquid deposition technique of the OSC is desired, compounds from the above list and derivatives thereof are limited to those that are soluble in an appropriate solvent or a mixture of appropriate solvents.

In other preferred composition embodiments in accordance with the present invention, the OSC materials are substituted oligoacenes such as pentacene, tetracene or anthracene, or heterocyclic derivatives thereof, more specifically oligoacenes that are substituted with alkylsilylethynyl groups, such as, bis(trialkylsilylethynyl) oligoacenes or bis(trialkylsilylethynyl) heteroacenes, for example, optionally fluorinated bis(trialkylsilylethynyl) anthradithiophenes, as disclosed for example in U.S. Pat. No. 6,690,029, WO 2005/055248 A1 or U.S. Pat. No. 7,385,221.

Where appropriate and needed to adjust the rheological properties as described for example in WO 2005/055248 A1, some embodiments of the present invention employ OSC compositions that include one or more organic binders.

The binder, which is typically a polymer, may comprise either an insulating binder or a semiconducting binder, or mixtures thereof may be referred to herein as the organic binder, the polymeric binder, or simply the binder.

Preferred binders according to the present invention are materials of low permittivity, that is, those having a permittivity a of 3.3 or less. The organic binder preferably has a permittivity a of 3.0 or less, more preferably 2.9 or less. Preferably the organic binder has a permittivity a at of 1.7 or more. It is especially preferred that the permittivity of the binder is in the range from 2.0 to 2.9. Whilst not wishing to be bound by any particular theory it is believed that the use of binders with a permittivity a of greater than 3.3, may lead to a reduction in the OSC layer mobility in an electronic device, for example an OTFT. In addition, high permittivity binders could also result in increased current hysteresis of the device, which is undesirable.

Examples of a suitable organic binders include polystyrene, or polymers or copolymers of styrene and α-methyl styrene, or copolymers including styrene, α-methylstyrene and butadiene may suitably be used. Further examples of suitable binders are disclosed for example in US 2007/0102696 A1.

In one type of embodiment, the organic binder is one in which at least 95%, in an other embodiment at least 98% and another embodiment when all of the atoms consist of hydrogen, fluorine and carbon atoms.

The binder is preferably capable of forming a film, more preferably a flexible film.

The binder can also be selected from crosslinkable binders, such as acrylates, epoxies, vinylethers, and thiolenes, preferably having a sufficiently low permittivity, very preferably of 3.3 or less. The binder can also be mesogenic or liquid crystalline.

In another embodiment the binder is a semiconducting binder, which contains conjugated bonds, especially conjugated double bonds and/or aromatic rings. Suitable and preferred binders are for example polytriarylamines as disclosed for example in U.S. Pat. No. 6,630,566.

The proportions of binder to OSC is typically 20:1 to 1:20 by weight, preferably 10:1 to 1:10 more preferably 5:1 to 1:5, still more preferably 3:1 to 1:3 further preferably 2:1 to 1:2 and especially 1:1. Dilution of the compound of formula I in the binder has been found to have little or no detrimental effect on the charge mobility, in contrast to what would have been expected from the prior art.

Further, in some embodiments in accordance with the present invention, the OSC materials are polymers or copolymers that encompass one or more repeating units selected from thiophene-2,5-diyl, 3-substituted thiophene-2,5-diyl, optionally substituted thieno[2,3-b]thiophene-2,5-diyl, optionally substituted thieno[3,2-b]thiophene-2,5-diyl, selenophene-2,5-diyl, or 3-substituted selenophene-2,5-diyl.

Further p-type OSCs are copolymers comprising electron acceptor and electron donor units. Copolymers of this embodiment are for example copolymers comprising one or more benzo[1,2-b:4,5-b']dithiophene-2,5-diyl units that are 4,8-disubstituted by one or more groups R as defined above, and further comprising one or more aryl or heteroaryl units selected from Group A and Group B, comprising at least one unit of Group A and at least one unit of Group B, wherein Group A consists of aryl or heteroaryl groups having electron donor properties and Group B consists of aryl or heteroaryl groups having electron acceptor properties, and Group A consists of selenophene-2,5-diyl, thiophene-2,5-diyl, thieno[3,2-b]thiophene-2,5-diyl, thieno[2,3-b]thiophene-2,5-diyl, selenopheno[3,2-b]selenophene-2,5-diyl, selenopheno[2,3-b]selenophene-2,5-diyl, selenopheno[3,2-b]thiophene-2,5-diyl, selenopheno[2,3-b]thiophene-2,5-diyl, benzo[1,2-b:4,5-b']dithiophene-2,6-diyl, 2,2-dithiophene, 2,2-diselenophene, dithieno[3,2-b:2',3'-d]silole-5,5-diyl, 4H-cyclopenta[2,1-b:3,4-b']dithiophene-2,6-diyl, 2,7-di-thien-2-yl-carbazole, 2,7-di-thien-2-yl-fluorene, indaceno[1,2-b:5,6-b']dithiophene-2,7-diyl, benzo[1",2":4,5;4",5":4',5']bis(silolo[3,2-b:3',2'-b']thiophene)-2,7-diyl, 2,7-di-thien-2-yl-indaceno[1,2-b:5,6-b']dithiophene, 2,7-di-thien-2-yl-benzo[1",2":4,5;4",5":4',5']bis(silolo[3,2-b:3',2'-b']thiophene)-2,7-diyl, and 2,7-di-thien-2-yl-phenanthro[1,10,9,8-c,d,e,f,g]carbazole, all of which are optionally substituted by one or more, one or two groups R as defined above, and Group B consists of benzo[2,1,3]thiadiazole-4,7-diyl, 5,6-dialkyl-benzo[2,1,3]thiadiazole-4,7-diyl, 5,6-dialkoxybenzo[2,1,3]thiadiazole-4,7-diyl, benzo[2,1,3]selenadiazole-4,7-diyl, 5,6-dialkoxy-benzo[2,1,3]selenadiazole-4,7-diyl, benzo[1,2,5]thiadiazole-4,7,diyl, benzo[1,2,5]selenadiazole-4,7,diyl, benzo[2,1,3]oxadiazole-4,7-diyl, 5,6-dialkoxybenzo[2,1,3]oxadiazole-4,7-diyl, 2H-benzotriazole-4,7-diyl, 2,3-dicyano-1,4-phenylene, 2,5-dicyano,1,4-phenylene, 2,3-difluoro-1,4-phenylene, 2,5-difluoro-1,4-phenylene, 2,3,5,6-tetrafluoro-1,4-phenylene, 3,4-difluorothiophene-2,5-diyl, thieno[3,4-b]pyrazine-2,5-diyl, quinoxaline-5,8-diyl, thieno[3,4-b]thiophene-4,6-diyl, thieno[3,4-b]thiophene-6,4-diyl, 3,6-pyrrolo[3,4-c]pyrrole-1,4-dione, all of which are optionally substituted by one or more, preferably one or two groups R as defined above.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, can be replaced by alternative features serving the same, equivalent or similar purpose. Thus, unless stated otherwise, each feature disclosed is one example only of a generic series of equivalent or similar features.

All of the features disclosed in this specification can be combined in any combination, except combinations where at least some of such features and/or steps are mutually exclusive. In particular, the features of the invention are applicable to all aspects of the invention and can be used in any combination. Likewise, features described in non-essential combinations can be used separately (not in combination).

The invention will now be described in more detail by reference to the following examples, which are illustrative only and do not limit the scope of the invention.

Above and below, unless stated otherwise percentages are percent by weight and temperatures are given in degrees Celsius (OC). The values of the dielectric constant ε ("permittivity" or "k") refer to values taken at 20° C. and 1,000 Hz.

A. Monomer Examples

Example A1. NBEtOparaPhPh Monomer Synthesis

A 2000 mL one-neck round bottom flask equipped with a magnetic stirbar was charged with cesium carbonate (71.75 g, 220.0 mmol, 1.5 equiv), dimethyl formamide (750 mL), 4-biphenol (25.0 g, 147.1 mmol, 1 equiv), and NBEtBr (44.3 g, 220.4 mmol, 1.5 equiv). The thick reaction slurry was allowed to stir overnight at room temperature. The base was filtered off using a coarse glass fritted funnel. The filtrate was diluted with acetonitrile (1 L) and the organics were washed with water (3×500 mL) followed by concentration to a small volume at which time the product precipitated out of solution. The solid was filtered affording 22.97 g (54%) of the target material as a white solid.

$^1$H NMR (CD$_2$Cl$_2$, 500 MHz): 7.63-7.55 (4H, m), 7.48-7.43 (2H, m), 7.36-7.32 (1H, m), 7.03-6.98 (2H, m), 6.23-6.03 (2H, m), 4.15-3.98 (2H, m), 2.88 (1H, s), 2.84 (1H, s), 3.32-2.25 (1H, m), 2.03-1.91 (1H, m), 1.73-1.57 (2H, m), 1.49-1.25 (2H, m), 0.69-0.57 (1H, m).

Example A1a. NBEtOorthoPhPh Monomer Synthesis

The title compound was analogously prepared by following the procedures of Example A1 except for using 2-biphenol instead of 4-biphenol.

Example A2. NBEtPhPh Monomer Synthesis

The monomer NBEtPhPh was prepared as follows. Magnesium (35.5 g, 1.46 mol) was placed inside a suitable reaction vessel equipped with a large stirbar, thermowell, condenser with valved gas inlet adapter and two appropriately sized addition funnels capped with septa. The vessel was heated to 193° C. while under a nitrogen purge. The magnesium was stirred. The vessel was cooled to 14° C. Five hundred mL anhydrous THF was transferred via cannula and vacuum into one addition funnel. 4-Bromobiphenyl (BrPhPh, 336.24 g, 1.44 mol) was dissolved under nitrogen in a septa-capped 1 L flask with 500 mL anhydrous THF. The mixture was sonicated and gave ~750 mL solution. This was transferred by cannula and vacuum into the other addition funnel. The BrPhPh/THF solution was added dropwise to the Mg. After 7 minutes, the temperature rose from 14 OC to 27° C., but the mixture was starting to reflux. The liquid level had not reached the tip of the thermowell. Five hundred mL of THF was added quickly. The temperature rose to 59° C. after another ten minutes. When the temperature dropped to 53° C., the addition rate of the BrPhPh/THF solution was increased. Addition of BrPhPh solution was completed after 2.25 h with the temperature reaching a maximum of 64° C. The reaction was heated at 60° C. for 5 h and the title compound was formed as a solution.

CuI (4.88 g, 0.026 mol) was placed inside a suitable reaction vessel fitted with a mechanical stirrer, addition funnel capped with septa, thermowell, and condenser with valved gas inlet adapter. The vessel was heated to 183° C. while stirring under nitrogen purge. The CuI turned yellow. The vessel was cooled to ~50° C. The CuI turned white. Five hundred ml anhydrous THF was transferred into the vessel. NBEtBr (226.5 g, 1.325 mol) was added via cannula and vacuum into the flask. The resulting mixture was stirred as PhPhMgBr was transferred via cannula and vacuum to the addition funnel and subsequently into NBEtBr/CuI/THF mixture. The resulting gray-green solution was heated to reflux at 67° C. overnight (19.7 h).

The reaction was cooled to 4° C. Five hundred mL of saturated aqueous NH₄Cl was added, causing the temperature to rise to 26° C. Another 500 ml saturated aqueous NH₄Cl was added. The mixture was stirred vigorously to thoroughly mix all solids. The mixture was filtered. The flask and filter cake were rinsed with 250 mL MTBE. The blue aqueous phase was separated from the green organic phase. The aqueous phase was extracted with 3×500 mL MTBE. The MTBE extracts were combined with the green organic phase. The combined mixture was washed with 4×500 mL brine to bring the pH to 7 from 10 and until the brine wash was no longer blue. The organic phase was dried over sodium sulfate, filtered, and rotary evaporated to 358.2 g (99% yield). The material was transferred to a one liter flask and distilled in the Kugelrohr still. Several fractions were collected at a temperature range between 160 and 173° C. at 0.73 to 0.83 Torr. The fractions were combined to give 208.7 g (56% yield) of a 96.9-98.9% (GC assay) pure material. $^1$H NMR (CDCl$_3$): δ 7.20-7.65 (aromatic resonances), 6.00-6.21 (olefinic resonances), 0.06-2.90 (aliphatic resonances). Based on the olefinic resonances, the ratio of the endo and exo isomers is 81:19.

Example A3

The monomers HexylNB and NBEtPhDMMI were prepared as described in the literature for example in US2012/0056183A1, or in analogy thereto.

B. Polymer Examples

B-I. Comparison Examples

Comparison Example BC1. Homopolymer pHexylNB

The homopolymer of HexylNB was prepared in analogy to Example BC3.

Comparison Example BC2. Polymer Blend DHexylNB:PVTMS 70:30

A polymer blend with a composition of pHexylNB:PVTMS (poly(vinyltoluene-co-α-methylstyrene)) 70:30 in dodecane was prepared by formulating the polymers by weight in the above ratio in a concentration of 12% by weight (e.g. in 10 g of formulation the total weight of both polymers is 1.2 g).

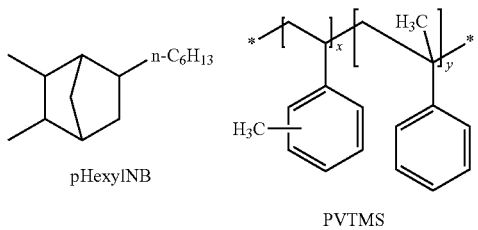

pHexylNB

PVTMS

Comparison Example BC3. Copolymer pHexylNB/NBEtPhDMMI 90/10

To a 250 mL crimp cap vial was added HexylNB (12.52 g, 70.2 mmol) and NBEtPhDMMI (2.52 g, 7.8 mmol) followed by dilution with toluene (32.8 g) and ethyl acetate (9.01 g). The vial was sealed with a septum then sparged for 30 min with N$_2$ and heated to 60° C. Once at temperature the catalyst solution (prepared in a glove box: (η$^6$-toluene)Ni (C$_6$F$_5$)$_2$ (0.378 g, 0.78 mmol) in toluene (3.26 g)) was added. The reaction mixture is allowed to stir overnight.

After catalyst residue removal, the polymer was precipitated by addition to 2 L of stirring methanol to precipitate the polymer. The precipitated solid was filtered and dried overnight under vacuum at 50° C. to afford 11.3 g (75% yield) of the target polymer as a white powdery solid (Mw: 69,700, Mw/Mn: 2.7) with composition of 90/10 HexylNB/NBEtPhDMMI (determined by NMR analysis).

Comparison Example BC4. Copolymer DHexylNB/NBEtPhDMMI 78/22

To a 100 mL crimp cap vial was added HexylNB (4.95 g, 27.7 mmol) and NBEtPhDMMI (2.97 g, 9.3 mmol) followed by dilution with toluene (17.5 g) and ethyl acetate (4.75 g). The vial was sealed with a septum then sparged for 30 min with N$_2$ and heated to 60° C. Once at temperature the catalyst solution (prepared in a glove box: (η$^6$-toluene)Ni (C$_6$F$_5$)$_2$ (0.179 g, 0.37 mmol) in toluene (1.55 g)) was added. The reaction is allowed to stir overnight.

After catalyst residue removal, the polymer was precipitated by addition to 2 L of stirring methanol to precipitate the polymer. The precipitated solid was filtered and dried overnight under vacuum at 50° C. to afford 6.7 g (85% yield) of the target polymer as a white powdery solid (Mw: 88,100, Mw/Mn: 3.1) with composition of 78/22 HexylNB/NBEtPhDMMI (determined by NMR analysis).

B-II. Working Examples

Example B1. Copolymer HexylNB/exo-NBPhPh 91/9

To a 250 mL crimp cap vial was added HexylNB (13.01 g, 72.9 mmol) and exo-NBPhPh (2.00 g, 8.1 mmol) followed by dilution with toluene (104.7 g) and ethyl acetate (27.02 g). The reactor was sealed with a septum then sparged for 30 min with N$_2$ and heated to 70° C. Once at temperature the catalyst solution (prepared in a glove box: (η$^6$-toluene)Ni (C$_6$F$_5$)$_2$ (0.393 g, 0.81 mmol) in toluene (3.39 g)) was added. The reaction is allowed to stir overnight.

After catalyst residue removal, the polymer was precipitated by addition to 2 L of stirring methanol to precipitate the polymer. The precipitated solid was filtered and dried overnight under vacuum at 50° C. to afford 11.9 g (79% yield) of the target polymer as a white powdery solid (Mw: 74,100, Mw/Mn: 2.9) with composition of 91/9 HexylNB/exo-NBPhPh (determined by NMR analysis).

Example B2. Copolymer pHexylNB/NBEtOparaPhPh 90/10

To a 250 mL crimp cap vial was added HexylNB (25.68 g, 144.0 mmol) and NBEtOparaPhPh (4.65 g, 16.0 mmol) followed by dilution with toluene (66.09 g) and ethyl acetate (18.19 g). The reactor was sealed with a septum then sparged for 30 min with N$_2$. The catalyst solution (prepared in a glove box: (η$^6$-toluene)Ni(C$_6$F$_5$)$_2$ (0.776 g, 1.6 mmol) in toluene (6.68 g)) was injected in one shot. The reaction is allowed to stir overnight.

After catalyst residue removal, the polymer was precipitated by addition to 2 L of stirring methanol to precipitate the polymer. The precipitated solid was filtered and dried overnight under vacuum at 50° C. to afford 27.1 g (89% yield) of the target polymer as a white powdery solid ($M_w$: 159,000, $M_w/M_n$: 3.7) with composition of 90/10 HexylNB/NBEtOparaPhPh (determined by NMR analysis).

Example B2a. Copolymer pHexylNB/NBEtOorthoPhPh 90/10

To a 60 mL crimp cap vial was added HexylNB (2.57 g, 14.4 mmol) and NBEtOorthoPhPh (0.46 g, 1.6 mmol) followed by dilution with toluene (6.6 g) and ethyl acetate (1.8 g). The reactor was sealed with a septum then sparged for 30 min with $N_2$. The catalyst solution (prepared in a glove box: ($\eta^6$-toluene)Ni($C_6F_5$)$_2$ (0.078 g, 0.16 mmol) in toluene (1 g)) was injected in one shot. The reaction was allowed to stir overnight.

After catalyst residue removal, the polymer was precipitated by addition to 0.5 L of stirring methanol to precipitate the polymer. The precipitated solid was filtered and dried overnight under vacuum at 50° C. to afford 2.78 g (92% yield) of the target polymer as a white powdery solid ($M_w$: 203,000 $M_w/M_n$: 3.8) with composition of 90/10 HexylNB/NBEtOorthoPhPh (determined by NMR analysis).

Example B3. Copolymer DHexylNB/NBEtPhPh 90/10

The target polymer with a composition of 90/10 HexylNB/NBEtPhPh was prepared in analogy to Example B5.

Example B4. Copolymer pHexylNB/NBEtPhPh 70/30

The target polymer with a composition of 70/30 HexylNB/NBEtPhPh was prepared in analogy to Example B5.

Example B5. Copolymer pHexylNB/NBEtPhPh 89/11

To a 250 mL crimp cap vial was added HexylNB (12.81 g, 71.8 mmol) and NBEtPhPh (2.19 g, 7.9 mmol) followed by dilution with toluene (32.65 g) and ethyl acetate (9.00 g). The reactor was sealed with a septum then sparged for 30 min with $N_2$. The catalyst solution (prepared in a glove box: ($\eta^6$-toluene)Ni($C_6F_5$)$_2$ (0.387 g, 0.79 mmol) in toluene (3.33 g)) was added. The reaction is allowed to stir overnight.

After catalyst residue removal, the polymer was precipitated by addition to 2 L of stirring methanol to precipitate the polymer. The precipitated solid was filtered dried overnight under vacuum at 50° C. to afford 14.0 g (93% yield) of the target polymer as a white powdery solid (Mw: 155,000, Mw/Mn: 3.5) with composition of 89/11 HexylNB/NBEtPhPh (determined by NMR analysis).

C. Device Examples

Example C1. OD Measurements

Solutions of polymers of interest were prepared in suitable solvents and thin films were coated onto quartz glass by spincoating to obtain films between 600 nm and 1200 nm in thickness. Absorbance spectra were then recorded on a UV-vis spectrometer and the OD values were calculated at the wavelength of interest (266 nm). The results are shown in Table 1 below.

TABLE 1

OD values at 266 nm for example polymers

| Example | Name | OD (at 266 nm) |
|---|---|---|
| BC1 | pHexylNB - reference | 0.01 |
| BC2 | pHexylNB:PVTMS blend (70:30) | 0.18 |
| BC3 | pHexylNB/NBEtPhDMMI 90/10 | 0.13 |
| BC4 | pHexylNB/NBEtPhDMMI 78/22 | 0.66 |
| B1 | pHexylNB/exo-NBPhPh 91/9 | 0.80 |
| B2 | pHexylNB/NBEtOparaPhPh 90/10 | 1.37 |
| B2a | pHexylNB/NBEtOorthoPhPh 90/10 | 0.3 |
| B3 | pHexNB/NBEtPhPh 90/10 | 0.89 |
| B4 | pHexNB/NBEtPhPh 70/30 | 2.57 |

Figure 3:
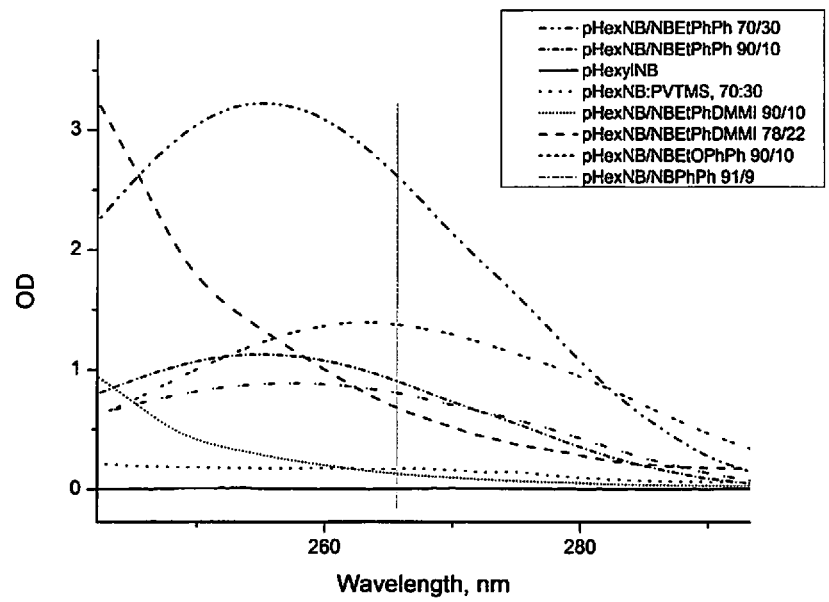
FIG. 3 shows the absorption profiles of polymers of working examples B1, B2, B3 and B4 and the polymer blend and polymers of comparison examples BC1, BC2, BC3 and BC4.
Figure 4:
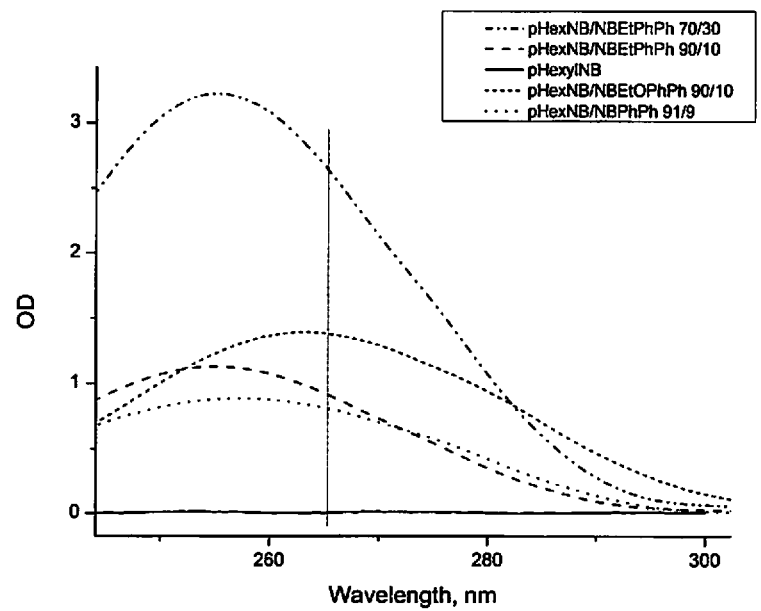
FIG. 4 shows the absorption profiles of the polymers of working examples B1, B2, B3 and B4 in comparison to the polymer of comparison example BC1.
Figure 5:
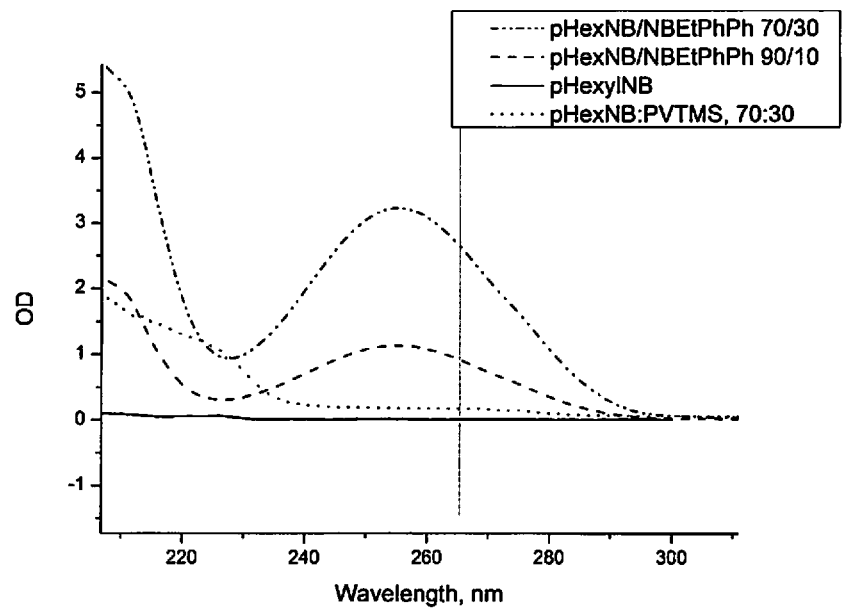
FIG. 5 shows the absorption profiles of polymers B3 and B4 according to the invention in comparison to the polymer of comparison example BC1 and polymer blend of comparison example BC2.

FIG. 3 shows the absorption profiles of all polymers from Table 1. FIG. 4 shows the absorption profiles of the polymers of working examples B1, B2, B3 and B4 in comparison to reference polymer pHexylNB of comparison example BC1. FIG. 5 shows the absorption profiles of polymers B3 and B4 according to the invention in comparison to reference polymer BC1 and polymer blend BC2.

It can be seen from Table 1 and FIG. 3-5 that the reference polymers and polymer blend BC1-BC4 exhibit no or only insufficient absorbance and are thus not suitable to facilitate the laser ablation process. This demonstrates that not all incorporated chromophores provide equal absorption improvements at the wavelength of interest, which can be explained by the very nature of particular chromophores. For example, the DMMI moiety has its peak absorption at much shorter wavelengths, hence the overall contribution at 266 nm is expected to be quite modest. in contrast thereto, the biphenyl (PhPh) group shows its peak absorption around 255 nm and can thus serve as a suitable substituent for the intended application.

Example C2. OTFT Devices

To assess the OTFT performance of the polymers they were used as gate dielectric material in standard top gate, bottom contact OFET devices as exemplarily illustrated in FIG. 1, using the OSC polymer Lisicon®SP400 (obtained from Merck GmbH).Unless stated otherwise, device fabrication was done as described for example in US2012/0056183A1.

The dielectric constants (k-values) were measured prior to the OTFT device fabrication in order to enable calculation of charge carrier mobilities in these TFTs. The constants were extracted from the measured capacitance of individual dielectrics in a built capacitor device. The capacitor device was made by spincoating the dielectric on ITO-coated glass, followed by deposition of the second electrode, in this case silver. Capacitor performance was then measured. The results are shown in Table 2 below.

TABLE 2

Dielectric constant values for example polymers

| Example | Name | Dielectric constant |
|---|---|---|
| BC1 | pHexylNB - reference | 2.1 |
| BC2 | pHexylNB:PVTMS blend (70:30) | 2.3 |
| BC3 | pHexylNB/NBEtPhDMMI 90/10 | 2.2 |
| BC4 | pHexylNB/NBEtPhDMMI 78/22 | 2.3 |
| B1 | pHexylNB/exo-NBPhPh 91/9 | 2.2 |
| B2 | pHexylNB/NBEtOPhPh 90/10 | 2.3 |
| B3 | pHexNB/NBEtPhPh 90/10 | 2.0 |
| B4 | pHexNB/NBEtPhPh 70/30 | 2.2 |

From Table 2 it can be seen that inclusion of the moieties bearing hetero-atoms into the polymer (like N atoms in DMMI or O atoms in NBEtOPhPh) has a stronger impact on the dielectric constant than a more extensive substitution with C—H based chromophores (like Ph). Therefore moieties without heteroatoms, like NBEtPhPh, are especially suitable in systems where low dielectric constant values are preferred, where increased dielectric constant may lead to unacceptable loss of charge carrier mobility performance.

For the top gate (TG) device fabrication with the above materials as a dielectric layer, a series of solutions were formulated as summarized in Table 3 and then spin coated onto the OSC layer at given spin speeds and then annealed at 100° C. for 2 minutes for all devices. The reference OTFTs were fabricated with the pHexylNB as dielectric.

TABLE 3

| Example | Formulation | Spin Conditions | Film Thickness (nm) |
|---|---|---|---|
| BC1 | pHexylNB, 12.5% in decane (Ref) | 10 s 500 rpm, 30 s 1800 rpm | 800 |
| BC2 | pHexylNB:PVTMS (70:30), 12% TS in dodecane | 1100 rpm 30 sec | 850 |
| BC3 | pHexylNB/NBEtPhDMMI 90/10, 18% TS in dodecane | 2300 rpm 30 s | 750 |
| BC4 | pHexylNB/NBEtPhDMMI 78/22, 18% TS in 50:50 dodecane/benzyl acetate | 2050 rpm 30 s | 750 |
| B1 | pHexylNB/exo-NBPhPh 91/9, 16% TS in dodecane | 1500 rpm 30 s | 710 |
| B2 | pHexylNB/NBEtOPhPh 90/10, 15% TS in dodecane | 2200 rpm 30 s | 750 |
| B3 | pHexNB/NBEtPhPh 90/10, 10% TS in dodecane | 1200 rpm 30 s | 775 |
| B4 | pHexNB/NBEtPhPh 70/30, 10% TS in dodecane | 1300 rpm 30 s | 840 |

Device performance was recorded using Agilent probe station. FIG. 6-13 show the TG OTFT device performance of OTT devices using the polymer blend or the polymers of examples BC1-BC4 and B1-B4, respectively as gate dielectric and the polymer SP400 as semiconductor (50 μm channel length).

Figure 6:
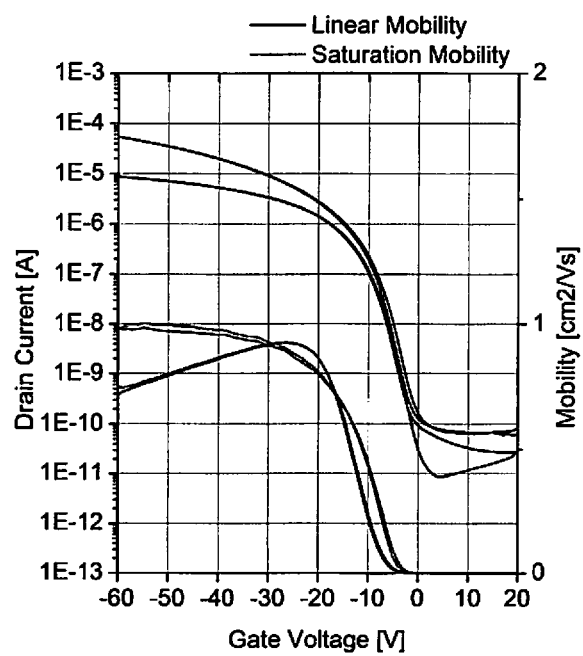
FIG. 6 shows the device performance of a TG OTFT device with a gate dielectric layer comprising the polymer blend of comparison example BC1.

FIG. 6 shows a device incorporating pHexylNB of Example BC1 as dielectric, which possesses virtually no absorbance at 266 nm. This is therefore used as a reference and to illustrate changes in performance which occur through copolymerisation with monomers bearing UV-absorbing chromophores as pendant chains.

Figure 7:
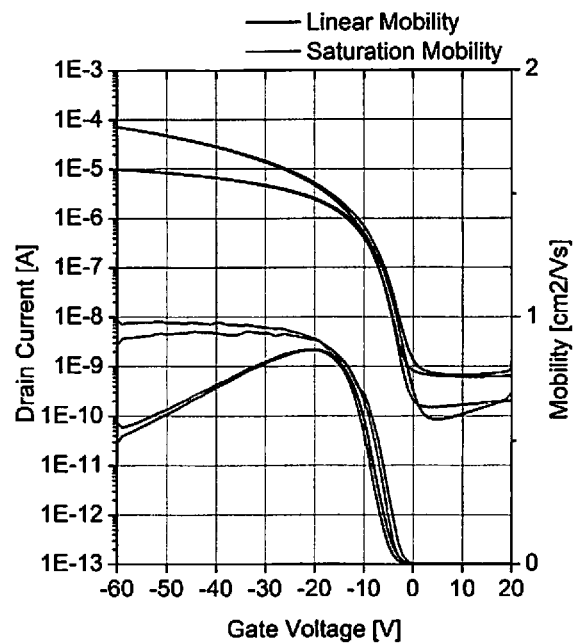
FIG. 7 shows the device performance of a TG OTFT device with a gate dielectric layer comprising the polymer of comparison example BC2.
Figure 8:
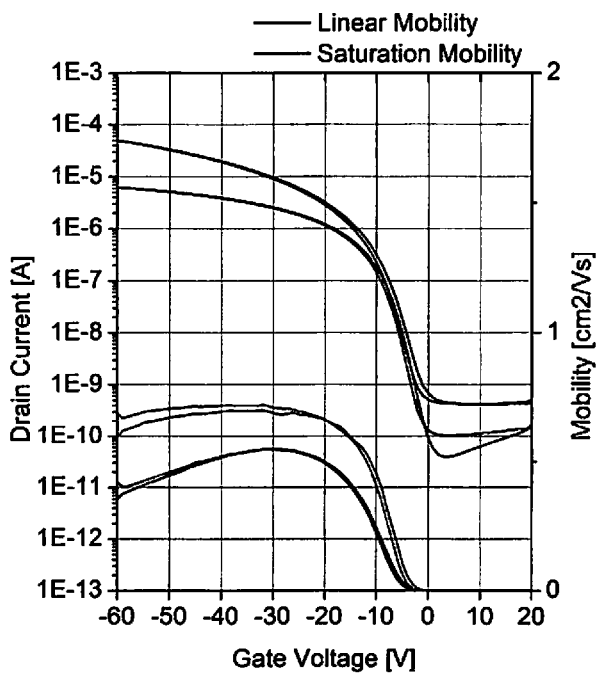
FIG. 8 shows the device performance of a TG OTFT device with a gate dielectric layer comprising the polymer of comparison example BC3.
Figure 9:
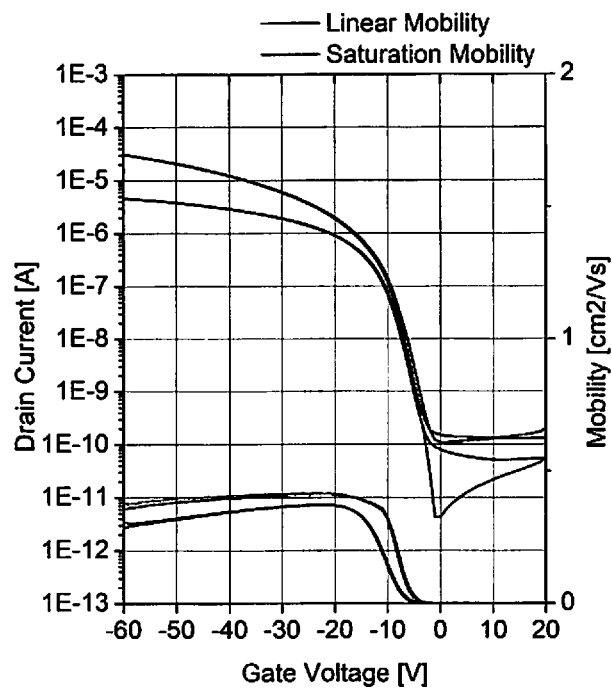
FIG. 9 shows the device performance of a TG OTFT device with a gate dielectric layer comprising the polymer of comparison example BC4.
Figure 10:
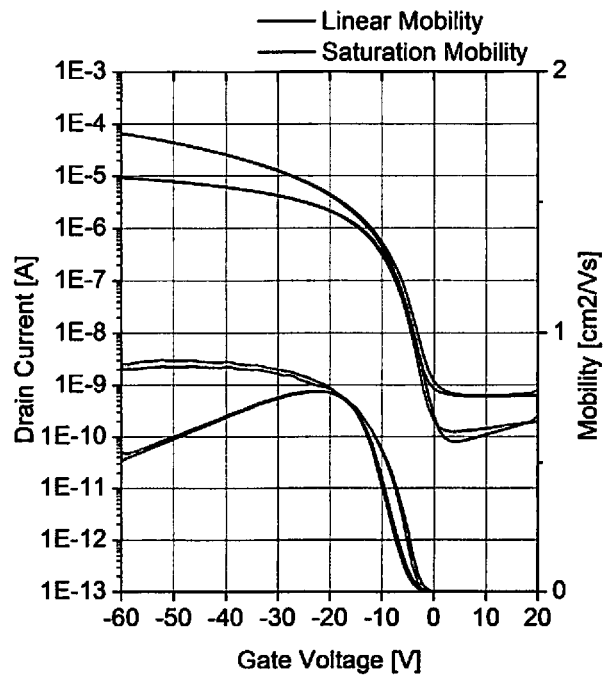
FIG. 10 shows the device performance of a TG OTFT device with a gate dielectric layer comprising the polymer of working example B1.
Figure 11:
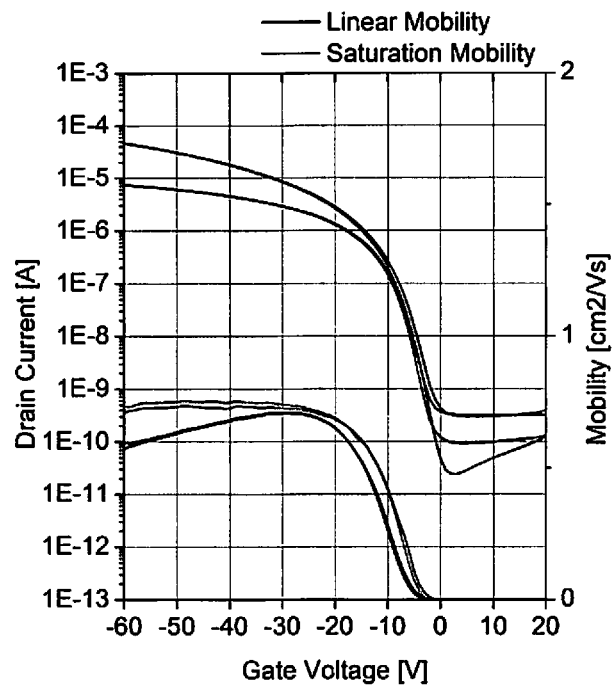
FIG. 11 shows the device performance of a TG OTFT device with a gate dielectric layer comprising the polymer of working example B2.
Figure 12:
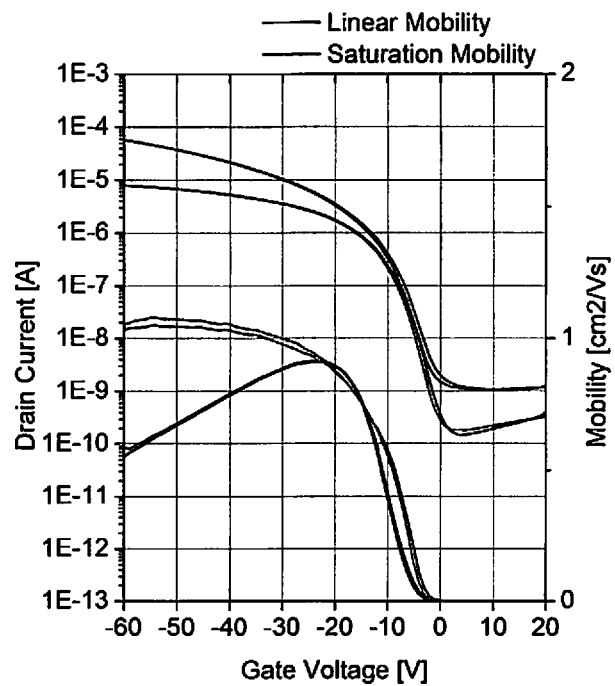
FIG. 12 shows the device performance of a TG OTFT device with a gate dielectric layer comprising the polymer of working example B3.
Figure 13:
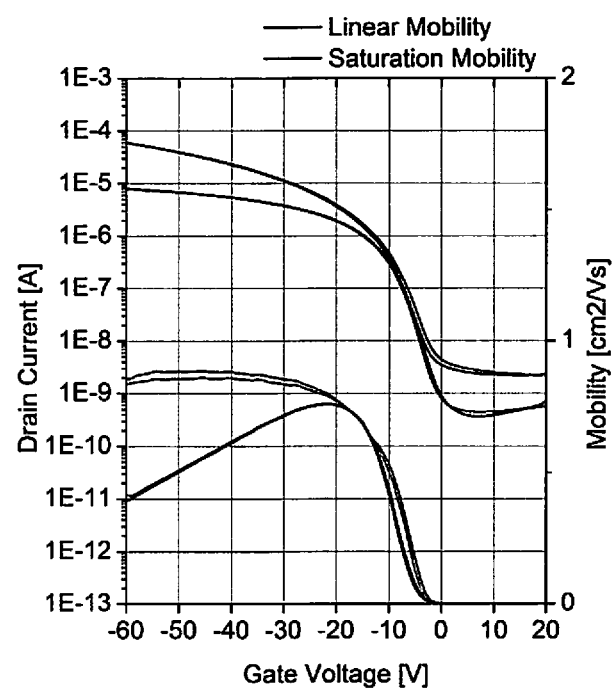
FIG. 13 shows the device performance of a TG OTFT device with a gate dielectric layer comprising the polymer of working example B4.

FIG. 7-9 show the TG performance obtained with the polymer blend of comparison example BC2 and the polymers of comparison examples BC3 and BC4, respectively. FIG. 10-13 show the TG performance obtained with the polymers of working examples B1, B2, B3 and B4, respectively. Compared to the reference device of FIG. 6, the notable charge carrier mobility decrease was observed with the increased ratios of DMMI-component in the copolymer (FIG. 7 and FIG. 8), which is attributed to the associated increase in the bulk dielectric constant value. A similar trend of dielectric constant increase was observed with incorporation of an ether-moiety through pendant chain substitution (FIG. 11). However, the charge-carrier mobility and other device performance characteristics are not solely dependent on the value of the dielectric constant, whereas the overall contribution by co-monomer's chemistry is more crucial.

The above data show that the use of the polymers according to the present invention, while leading to increased UV absorbance and thus better suitability for laser ablation process, does not have a negative influence on OTFT device performance.

Comparison example BC2 shows that a blend with another UV-absorbing polymer (like PVTMS) does not give a significant increase in the OD, but tends to raise the value of the dielectric constant.

Comparison examples BC3 and BC4 show that incorporation of a hetero-atom moiety into the polymer (like a DMMI unit or an ether functionality) may not provide sufficient increase in OD, but may well lead to undesirable increase in the dielectric constant values and thus, reduction in the charge carrier mobilities in OTFTs (see FIGS. 8 and 9). Moreover, they show that higher loading of heteroatomic chromophores can have a negative impact on solubility in the commonly used solvents. For example the polymer pHexylNB/NBEtPhDMMI 78/22 requires a solvent mixture in order to achieve acceptable solubility.

The working examples B1-B4 demonstrate that a significant boost in UV absorption can be achieved with retention of low dielectric constant, excellent solubility in solvents of interest as well as good device performance characteristics.

The invention claimed is:

1. An organic electronic (OE) device comprising a dielectric layer, said dielectric layer comprising polycycloolefinic polymer comprising one or more pendent groups having an absorption maximum in the range from 230 to 290 nm; wherein the polycycloolefinic polymer is a norbornene-type polymer having one or more first, distinct types of repeating units, which is selected from the group consisting of:

1

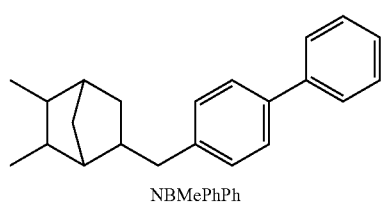

NBMePhPh

-continued

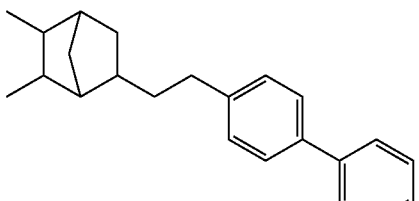

NBEtPhPh and

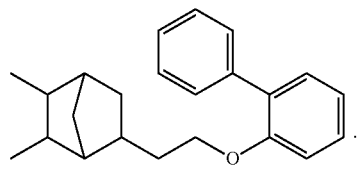

NBEtOorthoPhPh

2. The OE device according to claim 1, wherein the polycycloolefinic polymer having the repeating units is:

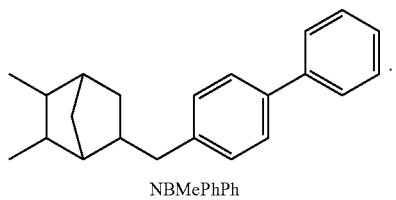

NBMePhPh

3. The OE device according to claim 1, wherein the polycycloolefinic polymer having the repeating units is:

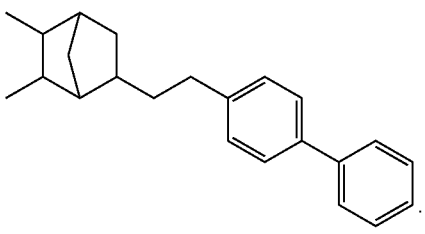

NBEtPhPh

4. The OE device according to claim 1, wherein the polycycloolefinic polymer having the repeating units is:

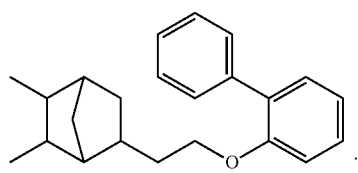

NBEtOorthoPhPh

5. The OE device according to claim 1, wherein the polycycloolefinic polymer additionally comprises one or more second, distinct types of repeating units of Formula I

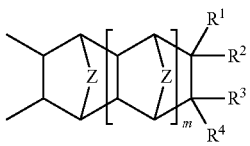

(I)

wherein one or more of $R^{1-4}$ are different from H and denote an alkyl or fluorinated alkyl group having from 1 to 20 C atoms.

6. The OE device according to claim 5, wherein the ratio of the first and second type of repeating units is from 95:5 to 5:95.

7. A dielectric layer in an OE device, said dielectric layer comprising a polycycloolefinic polymer as defined in claim 1.

8. The OE device according to claim 1, which is an Organic Thin Film Transistor (OTFT), Organic Light Emitting Diode (OLED) or Organic Photovoltaic (OPV) device or Organic Photodetector (OPD).

9. The OE device according to claim 8, which is a top gate OTFT or bottom gate OTFT.

10. The top gate OTFT according to claim 9, which comprises a substrate (1), source and drain electrodes (2a, 2b), an organic semiconductor (OSC) layer (3), a dielectric layer (4) comprising the polycycloolefinic polymer and serving as gate insulator, and gate electrode (5).

11. A process for preparing an OTFT according to claim 10, which comprises:
   A) forming source and drain electrodes (2a, 2b) on a substrate (1),
   B) forming an OSC layer (3) by deposition of an OSC material on the source and drain electrodes (2a, 2b),
   C) forming a dielectric layer (4) by deposition of the polycycloolefinic polymer on the OSC layer (3),
   D) forming a gate electrode (5) on the dielectric layer (4).

12. The bottom gate OTFT according to claim 9, which comprises a substrate (1), a gate electrode (5), a dielectric layer (4) comprising the polycycloolefinic polymer and serving as gate insulator, source and drain electrodes (2a, 2b), an OSC layer (3), and optionally a passivation layer (6).

13. A process for preparing an OTFT according to claim 12, which comprises:
   A) forming a gate electrode (5) on a substrate (1),
   B) forming a dielectric layer (4) by deposition of the polycycloolefinic polymer on the substrate (1) and the gate electrode (5),
   C) forming source and drain electrodes (2a, 2b) on the dielectric layer (4),
   D) forming an OSC layer (3) by deposition of an OSC material on the source and drain electrodes (2a, 2b) and the dielectric layer (4),
   E) optionally forming a passivation layer (6) on the OSC layer (3).

14. A process according to claim 11, wherein the OSC material of the OSC layer (3) and the polycycloolefinic polymer of the dielectric layer (4) are deposited from an organic solution.

15. A product or assembly comprising an OE device according to claim 1, which is an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a pressure sensor, an optical sensor, a chemical sensor, a biosensor or a biochip.

16. The process according to claim 13, wherein the OSC material of the OSC layer (3) and the polycycloolefinic polymer of the dielectric layer (4) are deposited from an organic solution.

* * * * *